(12) United States Patent
Takaishi

(10) Patent No.: US 9,543,246 B2
(45) Date of Patent: Jan. 10, 2017

(54) SEMICONDUCTOR DEVICE

(71) Applicant: PS4 Luxco S.a.r.l., Luxembourg (LU)

(72) Inventor: Yoshihiro Takaishi, Tokyo (JP)

(73) Assignee: LONGITUDE SEMICONDUCTORS S.A.R.L., Luxembourg (LU)

( * ) Notice: Subject to any disclaimer, the term of this patent is extended or adjusted under 35 U.S.C. 154(b) by 0 days.

(21) Appl. No.: 14/890,123

(22) PCT Filed: May 8, 2014

(86) PCT No.: PCT/JP2014/062331
§ 371 (c)(1),
(2) Date: Nov. 9, 2015

(87) PCT Pub. No.: WO2014/181819
PCT Pub. Date: Nov. 13, 2014

(65) Prior Publication Data
US 2016/0111362 A1 Apr. 21, 2016

(30) Foreign Application Priority Data
May 10, 2013 (JP) .................................. 2013-100429

(51) Int. Cl.
*H01L 23/52* (2006.01)
*H01L 23/528* (2006.01)
(Continued)

(52) U.S. Cl.
CPC ..... *H01L 23/528* (2013.01); *H01L 21/823487* (2013.01); *H01L 27/088* (2013.01);
(Continued)

(58) Field of Classification Search
CPC .............. H01L 23/528; H01L 29/7827; H01L 29/0657; H01L 27/092; H01L 29/4236; H01L 29/0649; H01L 29/1095; H01L 21/823487; H01L 27/088
See application file for complete search history.

(56) References Cited

U.S. PATENT DOCUMENTS

| 5,258,635 A | * | 11/1993 | Nitayama | H01L 27/0928 257/329 |
| 2009/0085102 A1 | * | 4/2009 | Takaishi | H01L 29/41741 257/329 |
| 2012/0270374 A1 | | 10/2012 | Masuoka et al. | |

FOREIGN PATENT DOCUMENTS

| JP | 2012-023305 A | * | 2/2012 | ............. H01L 29/78 |
| JP | 2012023305 | | 2/2012 | |

OTHER PUBLICATIONS

Application No. PCT/JP2014/062331, International Search Report, Jun. 24, 2014.

* cited by examiner

*Primary Examiner* — Roy Potter
*Assistant Examiner* — Paul Patton
(74) *Attorney, Agent, or Firm* — Kunzler Law Group, PC

(57) ABSTRACT

One semiconductor device includes one parallel transistor for connecting in parallel multiple vertical transistors disposed in an active region on a semiconductor substrate. The parallel transistor includes semiconductor pillars that project out in a direction perpendicular to a main surface of the semiconductor substrate; a lower diffusion layer that is disposed below the semiconductor pillars; upper diffusion layers that are each disposed on an upper section of the semiconductor pillars; and gate electrodes disposed, with a gate insulator film therebetween, on the entire side surfaces of the semiconductor pillars. The upper diffusion layers are connected to one upper contact plug that is disposed over the upper diffusion layers.

14 Claims, 15 Drawing Sheets

(51) Int. Cl.
*H01L 27/088* (2006.01)
*H01L 21/8234* (2006.01)
*H01L 27/092* (2006.01)
*H01L 29/06* (2006.01)
*H01L 29/10* (2006.01)
*H01L 29/423* (2006.01)
*H01L 29/78* (2006.01)

(52) U.S. Cl.
CPC ........ *H01L 27/092* (2013.01); *H01L 29/0649* (2013.01); *H01L 29/0657* (2013.01); *H01L 29/1095* (2013.01); *H01L 29/4236* (2013.01); *H01L 29/7827* (2013.01); *H01L 2924/0002* (2013.01)

ured even without increasing the planar surface area occupied by the transistor. Further, the vertical transistor has the advantage that the channel can be fully depleted, and it is therefore possible to obtain a satisfactory S-value (Sub-threshold swing value) and a large drain current.

SEMICONDUCTOR DEVICE

TECHNICAL FIELD

The present invention relates to a semiconductor device, and in particular relates to a semiconductor device provided with vertical transistors.

BACKGROUND

In recent years, vertical transistors have been proposed as a technology for miniaturizing transistors. A vertical transistor is a transistor which employs as a channel a semiconductor pillar (base pillar) extending in a direction (Z-direction) perpendicular to the main surface of a semiconductor substrate (the surface on which the transistor is formed, in other words the XY plane defined by the X-direction and the Y-direction).

More specifically, in a vertical transistor a semiconductor pillar is provided rising from the semiconductor substrate, and a gate electrode is provided at the periphery of the semiconductor pillar, with the interposition of a gate insulating film. A drain region and a drain electrode are provided at the bottom of the semiconductor pillar, and a source region and a source electrode are provided at the top of the semiconductor pillar.

The planar surface area occupied by the vertical transistor is smaller than in a conventional transistor in which the channel is disposed parallel to the main surface of the substrate, and the planar surface area occupied by the transistor does not increase even if the channel length (gate length) is increased. Short channel effects can therefore be suppressed even without increasing the planar surface area occupied by the transistor. Further, the vertical transistor has the advantage that the channel can be fully depleted, and it is therefore possible to obtain a satisfactory S-value (Sub-threshold swing value) and a large drain current.

Here, in order to obtain a high current-driving capability while maintaining the transistor characteristics, in some cases a semiconductor device employing a vertical transistor is provided with a plurality of semiconductor pillars, and upper diffusion layers and lower diffusion layers provided at the tops and bottoms of the plurality of semiconductor pillars are respectively connected in parallel. In this case, to achieve the parallel connections between the upper diffusion layers, contact plugs having a fatness (the size of a cross section cut through a plane parallel to the substrate surface of the silicon substrate) that is less than that of the semiconductor pillars are connected individually to the upper diffusion layer of each vertical transistor, and the upper surfaces of the contact plugs are connected to one another using a single wiring line.

Patent literature article 1 discloses a configuration of one parallel transistor in which four vertical transistors are connected in parallel.

PATENT LITERATURE

Patent literature article 1: Japanese Patent Kokai 2009-081389 (paragraph 0032, FIG. 2)

SUMMARY OF THE INVENTION

Problems to be Resolved by the Invention

In the parallel transistor described in patent literature article 1, four vertical transistors are disposed in one active region. Each vertical transistor has an upper diffusion layer, individual contact holes are disposed for each upper diffusion layer, and individual contact plugs are disposed filling the contact holes. One parallel transistor comprising the four vertical transistors is formed by connecting the individual contact plugs to the same wiring line disposed in an upper layer.

However, as a result of semiconductor device miniaturization, if lithography is used to form a pattern comprising a plurality of contact holes in close proximity to one another, the influence of optical proximity effects becomes pronounced, and it is not possible to form a pattern that is faithful to the photomask. As a result, a problem manifests itself in that it is not possible to ensure contact plug conduction. Further, if the position of a contact plug, as seen in a plan view, becomes displaced, the connection surface area with respect to the upper diffusion layer decreases, and wiring line resistance increases, resulting in the problem that the characteristics of the vertical transistor are unstable.

Means of Overcoming the Problems

The semiconductor device according to one aspect of the present invention is provided with one parallel transistor in which a plurality of vertical transistors disposed in an active region on a semiconductor substrate are connected in parallel, wherein the parallel transistor comprises: a plurality of semiconductor pillars protruding out in a direction perpendicular to a main surface of the semiconductor substrate; a lower diffusion layer disposed below the plurality of semiconductor pillars; a plurality of upper diffusion layers, disposed respectively at the top of the plurality of semiconductor pillars; and a gate electrode disposed over the side surfaces, in their entirety, of the plurality of semiconductor pillars, with the interposition of a gate insulating film; and wherein the plurality of upper diffusion layers are connected to one upper contact plug disposed on the plurality of upper diffusion layers.

The semiconductor device according to another aspect of the present invention is provided with an element isolation region disposed in a main surface of a semiconductor substrate, a first active region and a second active region which are enclosed by the element isolation region and are adjacent to one another in a first direction, and an intermediate element isolation region sandwiched between the first active region and the second active region; wherein the first active region comprises: a first semiconductor pillar adjacent to the intermediate element isolation region; a first upper diffusion layer located at the top of the first semiconductor pillar; a second semiconductor pillar adjacent, in the first direction, to the first semiconductor pillar; a second upper diffusion layer located at the top of the second semiconductor pillar; and a continuous first gate electrode enclosing the peripheries of the first semiconductor pillar and the second semiconductor pillar;

the second active region comprises: a third semiconductor pillar adjacent to the intermediate element isolation region; a third upper diffusion layer located at the top of the third semiconductor pillar; a fourth semiconductor pillar adjacent, in the first direction, to the third semiconductor pillar; a fourth upper diffusion layer located at the top of the fourth semiconductor pillar; and a continuous second gate electrode enclosing the peripheries of the third semiconductor pillar and the fourth semiconductor pillar;

the intermediate element isolation region comprises: a dummy pillar extending in the first direction across the first active region and the second active region; and a power-feed gate electrode enclosing the periphery of the dummy pillar;

the first gate electrode and the second gate electrode are each connected to the power-feed gate electrode;

the first upper diffusion layer and the second upper diffusion layer are connected to one first upper contact plug; and the third upper diffusion layer and the fourth upper diffusion layer are connected to one second upper contact plug.

Advantages Of The Invention

According to the semiconductor device of the present invention, rather than disposing individual upper contact plugs with respect to each upper diffusion layer, one upper contact plug is disposed connected collectively to a plurality of upper diffusion layers, and it is therefore possible to maintain the ease with which contact holes are formed, by avoiding the influence of optical proximity effects when lithography is performed. Further, the contact hole comprises a collective opening, and therefore even if the position of the contact hole becomes displaced, the connection surface area between the upper diffusion layers and the contact plug can be ensured, alleviating a reduction in the connection surface area, and therefore the characteristics of the vertical transistors can be stabilized.

MODES OF EMBODYING THE INVENTION

[First Mode of Embodiment]

Figure 1:
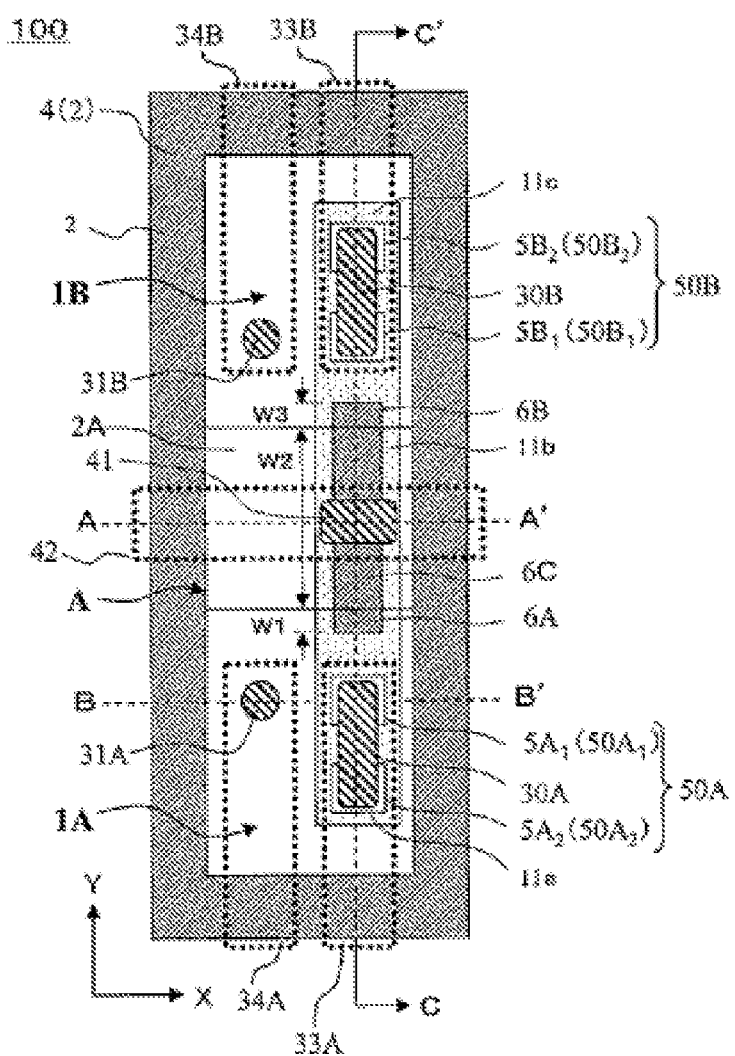
FIG. 1 is a schematic diagram (plan view) illustrating the structure of a semiconductor device according to a first mode of embodiment of the present invention.

A first mode of embodiment of the present invention will be described in detail with reference to the drawings. In the drawings hereinbelow, the scale and quantity of each component, for example, differ from those of the actual components, in order to facilitate understanding of each component. Further, the arrangement of each component is described by defining an X-Y-Z coordinate system. In this coordinate system, the Z-direction (third direction) is a direction perpendicular to the main surface of a silicon substrate, the X-direction (second direction) is a direction orthogonal to the Z-direction in a plane parallel to the main surface of the silicon substrate, and the Y-direction (first direction) is a direction orthogonal to the X-direction in a plane parallel to the main surface of the silicon substrate. The configuration is the same in the other modes of embodiment.

(Semiconductor Device)

The configuration of a semiconductor device 100 according to the first mode of embodiment of the present invention will be described with reference to FIG. 1 to FIG. 4.

First, as illustrated in FIG. 1, the semiconductor device 100 according to the first mode of embodiment is provided with a semiconductor substrate, which is a silicon substrate 1 comprising a p-type single crystal, on which are provided an element isolation region 2 formed as an STI (Shallow Trench Isolation), and a first active region 1A and a second active region 1B comprising the semiconductor substrate enclosed by the element isolation region 2. Within the element isolation region 2, the element isolation region 2 located in a region sandwiched between the first active region 1A and the second active region 1B, in particular, is described as an intermediate element isolation region 2A. The first active region 1A and the second active region 1B are therefore adjacent to one another in the Y-direction with the interposition of the intermediate element isolation region 2A.

In FIG. 1, the components in the first active region 1A and the components in the second active region 1B are disposed with a positional relationship that has line symmetry in the Y-direction about a centerline laterally traversing, in the X-direction, the intermediate element isolation region 2A, which is located between the first active region 1A and the second active region 1B. However, the present invention is not limited to this arrangement, and the size of each active region and the number of transistors disposed therein, for example, may differ. Further, in the present invention, other constituent elements may additionally be disposed in either of the active regions.

For convenience of explanation, the configurations in the two active regions 1A and 1B presented in FIG. 1 are the same, and therefore the configuration in the first active region 1A is mainly described hereinafter. It should be noted that constituent elements in the first active region 1A are assigned reference codes with the letter A at the end, and similarly constituent elements in the second active region 1B are assigned reference codes with the letter B at the end. Further, when the constituent elements in the active regions 1A and 1B are being referred to generically without differentiation, the final letter in the reference code is omitted.

In the first active region 1A, two transistors, namely a first transistor $50A_1$ and a second transistor $50A_2$, comprising vertical transistors, are disposed side-by-side in the Y-direction. An impurity-diffused layer is provided in an obverse surface part of the first active region 1A located at the periphery of each transistor $50A_1$ and $50A_2$, forming a first lower diffusion layer 9a which is shared by the transistors $50A_1$ and $50A_2$. A first lower diffusion layer contact plug (first lower contact plug) 31A shared by the two transistors $50A_1$ and $50A_2$ is disposed on the first lower diffusion layer 9a. The two transistors $50A_1$ and $50A_2$ are configured in such a way as to be connected to one another by way of one first upper diffusion layer contact plug (first upper contact plug) 30A which is disposed above said two transistors. The configuration of the two transistors $50A_1$ and $50A_2$ is therefore such that, by sharing the first lower diffusion layer 9a, lower portions of each of the two transistors $50A_1$ and $50A_2$ are connected together, and by the first upper contact plug 30A being disposed, upper portions of the two transistors $50A_1$ and $50A_2$ are connected together. In other words, the two vertical transistors $50A_1$ and $50A_2$ are connected in parallel by means of the first upper contact plug 30A, to form one first parallel transistor 50A.

Similarly two transistors, namely a third transistor $50B_1$ and a fourth transistor $50B_2$, a second lower diffusion layer 9b shared by the transistors $50B_1$ and $50B_2$ and a second lower diffusion layer contact plug (second lower contact plug) 31B connected to the second lower diffusion layer 9b are disposed in the second active region 1B. Further, the two transistors $50B_1$ and $50B_2$ are connected to one another by way of one second upper diffusion layer contact plug (second upper contact plug) 30B which is disposed above said two transistors, to form one second parallel transistor 50B.

A rectangular pillar groove forming region A is disposed, containing the active regions 1A and 1B and the intermediate element isolation region 2A located therebetween. As discussed hereinbelow, a dummy pillar 6 used to apply a gate voltage to the gate electrodes of the two vertical transistors in each active region is disposed at the boundary between the first active region 1A and the intermediate element isolation region 2A in the pillar groove forming region A, and the boundary between the second active region 1B and the intermediate element isolation region 2A.

The dummy pillar 6 is formed from a first dummy silicon pillar 6A disposed on the first active region 1A side, a second dummy silicon pillar 6B disposed on the second active region 1B side, and a dummy insulating film pillar 6C disposed in the intermediate element isolation region 2A. The first dummy silicon pillar 6A and the dummy insulating film pillar 6C are in contact with one another at one side surface, to form a united first combined pillar. Similarly, the second dummy silicon pillar 6B and the dummy insulating film pillar 6C also form a second combined pillar. The dummy insulating film pillar 6C is disposed longitudinally traversing the intermediate element isolation region 2A in the Y-direction, spanning between the first active region 1A and the second active region 1B. In other words, the dummy pillar 6 has a configuration in which the dummy insulating film pillar 6C is shared, and the first and second combined pillars are disposed at both ends thereof in the Y-direction.

In the first active region 1A, silicon pillars (semiconductor pillars) 5A which form the channels of the transistors $50A_1$ and $50A_2$ are configured in such a way as to form rectangles in which the width in the X-direction (second direction) and the width in the Y-direction (first direction) perpendicular to the X-direction are the same. The silicon pillars 5A are configured in such a way that their widths in the X-direction and the Y-direction are F, where F is the resolution limit of a pattern in lithography, in other words the minimum processing dimension. Here, F is 30 nm, for example. It should be noted that the planar shape of the silicon pillars 5A is not limited to being rectangular, and may be circular. In the case of a circle, the diameter is 30 nm.

As described hereinabove, the silicon pillars 5A form the channel portions of the transistors $50A_1$ and $50A_2$ respectively. To elaborate, a first silicon pillar $5A_1$ corresponds to the channel portion of the first transistor $50A_1$, and a second silicon pillar $5A_2$ corresponds to the channel portion of the second transistor $50A_2$.

Similarly, in the second active region 1B, a third silicon pillar $5B_1$ corresponds to the channel portion of the third transistor $50B_1$, and a fourth silicon pillar $5B_2$ corresponds to the channel portion of the fourth transistor $50B_2$.

In the first active region 1A, individual silicon plugs 19Aa and 19Ab are disposed directly above the transistors $50A_1$ and $50A_2$ respectively, as discussed hereinbelow. Further, the first upper contact plug 30A and a first upper plug wiring line 33A, shared by the individual silicon plugs 19Aa and 19Ab, are disposed in overlapping positions.

For example, in the first active region 1A, the two transistors $50A_1$ and $50A_2$, and the corresponding silicon plugs 19Aa and 19Ab are disposed overlapping one another respectively as seen in a plan view. The first upper contact plug 30A is disposed extending in the Y-direction, the direction in which the two transistors $50A_1$ and $50A_2$ are disposed, in such a way as to be shared by the two silicon plugs 19Aa and 19Ab. The first upper plug wiring line 33A is connected by way of the first upper contact plug 30A and the silicon plugs 19Aa and 19Ab to diffusion layers 16aa and 16ab, which are constituents of the transistors $50A_1$ and $50A_2$ thereby serving as a power-feed wiring line for the transistors $50A_1$ and $50A_2$.

Thus in the first active region 1A, the two transistors $50A_1$ and $50A_2$ are connected in parallel by means of the first upper contact plug 30A to form the single first parallel transistor 50A. The first upper contact plug 30A extends in the Y-direction, but the configuration is not limited to this, and the first upper contact plug 30A may extend in the X-direction, or in the X-direction and the Y-direction.

The configuration is the same in the second active region 1B.

In other words, in the second active region 1B, individual silicon plugs 19Ba and 19Bb are disposed directly above the transistors $50B_1$ and $50B_2$ respectively, as discussed hereinbelow. Further, the second upper contact plug 30B and a second upper plug wiring line 33B, shared by the individual silicon plugs 19Ba and 19Bb, are disposed in overlapping positions.

For example, in the second active region 1B, the two transistors $50B_1$ and $50B_2$ and the corresponding silicon plugs 19Ba and 19Bb are disposed overlapping one another respectively as seen in a plan view. The second upper contact plug 30B is disposed extending in the Y-direction, the direction in which the two transistors $50B_1$ and $50B_2$ are disposed, in such a way as to be shared by the two silicon plugs 19Ba and 19Bb. The second upper plug wiring line 33B is connected by way of the second upper contact plug 30B and the silicon plugs 19Ba and 19Bb to diffusion layers 16ba and 16bb, which are constituents of the transistors $50B_1$ and $50B_2$, thereby serving as a power-feed wiring line for the transistors $50B_1$ and $50B_2$.

Thus in the second active region 1B, the two transistors $50B_1$ and $50B_2$ are connected in parallel by means of the second upper contact plug 30B to form the single second parallel transistor 50B. The second upper contact plug 30B extends in the Y-direction, but the configuration is not limited to this, and the second upper contact plug 30B may extend in the X-direction, or in the X-direction and the Y-direction.

The rectangular dummy pillar 6 is disposed in such a way as to be sandwiched between and adjacent, with a fixed spacing, to the first silicon pillar $5A_1$ and the third silicon pillar $5B_1$. The rectangular dummy pillar 6 is disposed spanning between the first active region 1A, the second active region 1B and the intermediate element isolation region 2A. Here, the fixed spacing is F (30 nm).

As discussed hereinabove, the dummy pillar 6 is formed from the first dummy silicon pillar 6A disposed on the first active region 1A side, the second dummy silicon pillar 6B disposed on the second active region 1B side, and one dummy insulating film pillar 6C disposed in the intermediate element isolation region 2A.

One side surface of the first dummy silicon pillar 6A is in contact with one side surface of the dummy insulating film pillar 6C to form an integrated body, and one side of the second dummy silicon pillar 6B is similarly configured. The width W2, in the Y-direction, of the dummy insulating film pillar 6C is set to between 1.5 F and 3 F. Further, W1 and W3, in the Y-direction, of the first dummy silicon pillar 6A and the second dummy silicon pillar 6B respectively are set to between F/2 and F.

A rectangular gate power-feed contact plug (gate power-feed plug) 41 is disposed directly above the dummy insulating film pillar 6C. The gate power-feed plug 41 is disposed in a position that partially overlaps the dummy insulating film pillar 6C, but is formed protruding slightly to the outside, in the X-direction, of the dummy insulating film pillar 6C. It should be noted that in FIG. 1, the gate power-feed plug 41 overlaps both side surface portions, in the X-direction, of the dummy insulating film pillar 6C, but the present invention is not limited to this configuration, and it is sufficient for the gate power-feed plug 41 to be offset toward one side surface portion.

Figure 2:
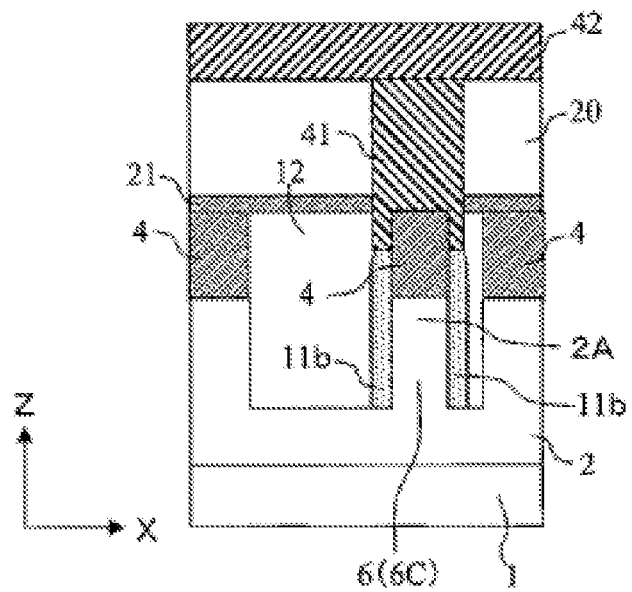
FIG. 2 is a cross-sectional view through the line A-A' in FIG. 1.
Figure 3:
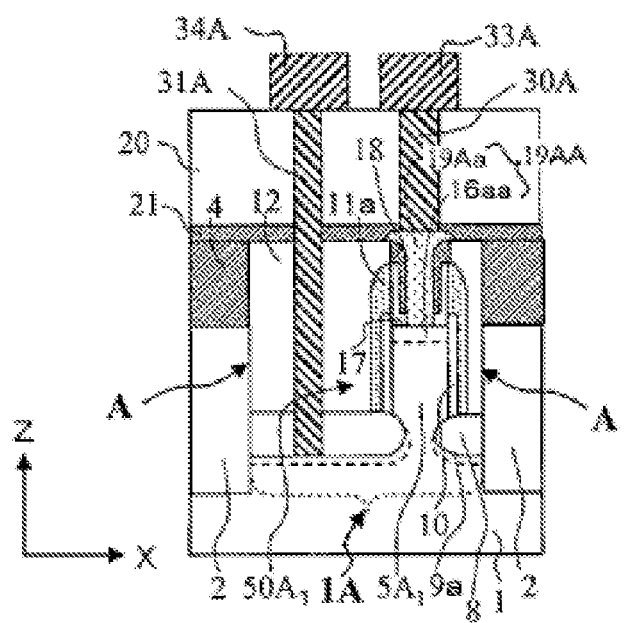
FIG. 3 is a cross-sectional view through the line B-B' in FIG. 1.
Figure 4:
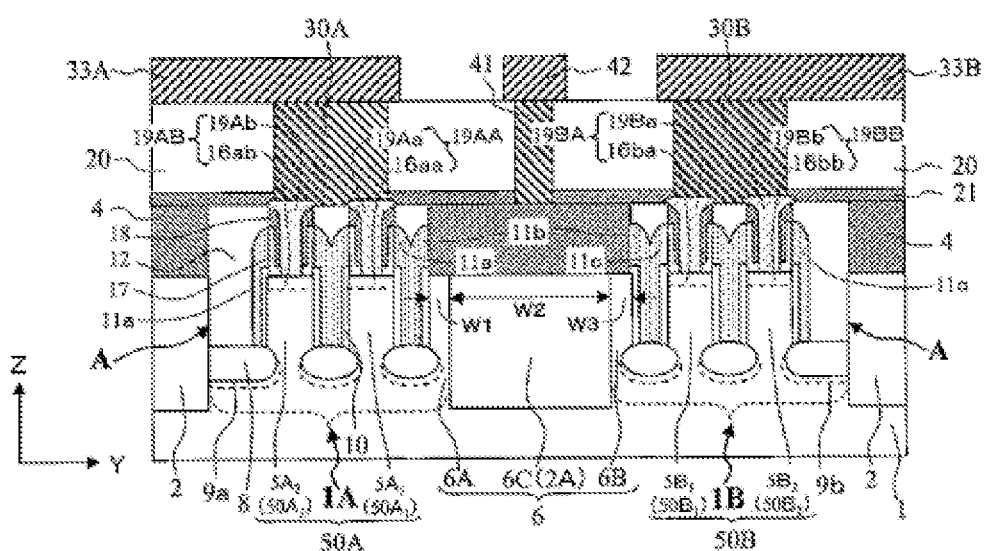
FIG. 4 is a cross-sectional view through the line C-C' in FIG. 1.

With reference to FIG. 2 to FIG. 4, the cross-sectional structures of the transistors $50A_1$, $50A_2$, $50B_1$ and $50B_2$ in the first active region 1A and the second active region 1B will next mainly be described, in the same way as in FIG. 1. FIG. 2 is a cross-sectional view through the line A-A' in FIG. 1, FIG. 3 is a cross-sectional view through the line B-B' in FIG. 1, and FIG. 4 is a cross-sectional view through the line C-C' in FIG. 1.

As illustrated in FIG. 3 and FIG. 4, the first silicon pillar $5A_1$ and the second silicon pillar $5A_2$, which rise from an excavated surface of the first active region 1A, are disposed in the first active region 1A. First gate electrodes 11a are provided, with the interposition of gate insulating films 10, on the side surfaces of the first silicon pillar $5A_1$ and the second silicon pillar $5A_2$. The first gate electrodes 11a fill spaces between the adjacent silicon pillars $5A_1$ and $5A_2$ thereby being connected to one another to form the first gate electrode 11a that is shared by the plurality of silicon pillars $5A_1$ and $5A_2$.

Second gate electrodes 11c are similarly disposed on the side surfaces of the third silicon pillar $5B_1$ and the fourth silicon pillar $5B_2$ disposed in the second active region 1B.

Meanwhile, a power-feed gate electrode 11b is provided on the side surfaces of the dummy pillar 6, and the spaces between the dummy pillar 6 and the silicon pillars $5A_1$ and $5B_1$ closest to the dummy pillar 6 are filled by the power-feed gate electrode 11b, the first gate electrode 11a and the second gate electrode 11c, thereby connecting the power-feed gate electrode 11b to the first gate electrode 11a and the second gate electrode 11c. The first parallel transistor 50A and the second parallel transistor 50B therefore have a configuration having a shared gate electrode.

As illustrated in FIG. 2, the parts of the gate power-feed plug 41 which protrude in the X-direction from the dummy insulating film pillar 6C as seen in a plan view are connected to an upper surface of the power-feed gate electrode 11b provided on the side surfaces of the dummy insulating film pillar 6C. As illustrated in FIG. 2 and FIG. 3, the thickness, in the X-direction, of the power-feed gate electrode 11b and the first gate electrode 11a disposed on the side surfaces of each pillar is 20 nm. The second gate electrode 11c is also formed to the same thickness. The thickness of the gate electrodes 11 is 20 nm, and therefore the spaces between each pillar, set to 30 nm as discussed hereinabove, and the spaces between the silicon pillars and the dummy pillar, are each at most equal to twice the thickness of the gate electrodes 11.

Therefore the gate electrodes 11, having a thickness of 20 nm, provided on the side surfaces of the first silicon pillar $5A_1$, the second silicon pillar $5A_2$ and the dummy pillar 6 are in contact with one another in the parts where the spacing between the pillars is 30 nm, which is at most equal to twice the thickness of the gate electrodes 11, and the gate electrodes 11 thus function as a single gate electrode. By means of this configuration, the gate voltage applied from the power-feed gate electrode 11b on the dummy pillar 6 is applied by way of the first gate electrode 11a on the first silicon pillar $5A_1$ to the first gate electrode 11a on the second silicon pillar $5A_2$.

The second gate electrode 11c also has the same configuration.

As illustrated in FIG. 3 and FIG. 4, the first silicon pillar $5A_1$ and the second silicon pillar $5A_2$, which are semiconductor base pillars, are provided upright in the first active region 1A. Further, the third silicon pillar $5B_1$ and the fourth silicon pillar $5B_2$, are provided upright in the second active region 1B. The four silicon pillars $5A_1$, $5A_2$, $5B_1$ and $5B_2$ are disposed in such a way as to have the same height. Further, the fatness (the size of a cross section cut through a plane parallel to the substrate surface of the silicon substrate) of each silicon pillar $5A_1$, $5A_2$, $5B_1$ and $5B_2$ is a fatness which allows full depletion to occur.

The transistors 50 are each provided, in upper end portions and lower end portions of the silicon pillars 5, with impurity-diffused layers. The diffusion layers 16 located in the upper end portions of the silicon pillars 5 are one of either the source or the drain, and the lower diffusion layers 9 located in the lower end portions of the silicon pillars 5 are the other of the source and the drain. Central portions of the silicon pillars 5 sandwiched between the diffusion layers 16 and the lower diffusion layers 9 form channel portions.

The first diffusion layer 16aa, comprising an n-type semiconductor layer, is disposed in the upper end portion of the first silicon pillar $5A_1$. Further, the first silicon plug 19Aa is connected to the upper surface of the first diffusion layer 16aa. The first silicon plug 19Aa is formed from an n-type semiconductor layer containing an n-type impurity. Therefore, although the first diffusion layer 16aa and the first silicon plug 19Aa are formed in different steps, they both comprise n-type semiconductor layers, and as such are integrated.

In the following description, the first diffusion layer 16aa and the first silicon plug 19Aa are described in a united manner as a first upper diffusion layer 19AA. Therefore the first transistor $50A_1$ has a configuration in which it is provided with the first upper diffusion layer 19AA.

Similarly, the second transistor $50A_2$ is provided with a second upper diffusion layer 19AB in which the second diffusion layer 16ab and the second silicon plug 19Ab are integrated, and the third transistor $50B_1$ is provided with a third upper diffusion layer 19BA in which the third diffusion layer 16ba and the third silicon plug 19Ba are integrated. Further, the fourth transistor $50B_2$ has a configuration in which it is provided with a fourth upper diffusion layer 19BB in which the fourth diffusion layer 16bb and the fourth silicon plug 19Bb are integrated.

An insulating film 8 is provided on an excavated upper surface of the first active region 1A located at the peripheries of the first and second silicon pillars $5A_1$ and $5A_2$ and the first dummy silicon pillar 6A. The insulating film 8 covers the peripheries of the first and second silicon pillars $5A_1$ and $5A_2$ and the first dummy silicon pillar 6A, and reaches the element isolation region 2. The first lower diffusion layer 9a is disposed in such a way as to overlap the insulating film 8, below the insulating film 8, and the first lower diffusion layer 9a and the first gate electrode 11a are electrically insulated from one another by means of the insulating film 8. The first lower diffusion layer 9a electrically connects the two silicon pillars $5A_1$ and $5A_2$ to one another, and forms a lower diffusion layer common to the first transistor $50A_1$ and the second transistor $50A_2$.

The second lower diffusion layer 9b has the same configuration and is located below the insulating film 8, the second gate electrode 11c and the second lower diffusion layer 9b being insulated from one another by means of the insulating film 8, and forming a lower diffusion layer common to the third transistor $50B_1$ and the fourth transistor $50B_2$.

As illustrated in FIG. 3, the configuration is such that a first lower plug wiring line 34A is disposed on the upper surface of the first lower diffusion layer 9a with the interposition of the first lower contact plug 31A. The second lower diffusion layer 9b disposed in the second active region 1B has the same configuration, and is connected to a second lower plug wiring line 34B by way of the second lower contact plug 31B.

Gate insulating films 10 are disposed on the side surfaces of the first and second silicon pillars $5A_1$ and $5A_2$, the third and fourth silicon pillars $5B_1$ and $5B_2$, and the first dummy silicon pillar 6A and the second dummy silicon pillar 6B. The first gate electrode 11a having a thickness of 20 nm is disposed on the side surfaces of the first and second silicon pillars $5A_1$ and $5A_2$, with the interposition of the gate insulating films 10, and the second gate electrode 11c having a thickness of 20 nm is disposed on the side surfaces of the third and fourth silicon pillars $5B_1$ and $5B_2$, with the interposition of the gate insulating films 10. Further, the power-feed gate electrode 11b having a thickness of 20 nm is disposed on the side surfaces of the dummy pillar 6. It should be noted that only the power-feed gate electrode 11b is disposed on the side surfaces of the dummy insulating film pillar 6C, without the interposition of the gate insulating film.

In the first active region 1A, the gate insulating films 10 cover the outer peripheral surfaces of the silicon pillars $5A_1$ and $5A_2$, and are connected to the insulating film 8. The channel portions of the silicon pillars $5A_1$ and $5A_2$, the first and second upper diffusion layers 19AA and 19AB, and the first lower diffusion layer 9a are electrically insulated from the first gate electrode 11a by means of the gate insulating films 10 and the insulating film 8.

Similarly, in the second active region 1B, the gate insulating films 10 cover the outer peripheral surfaces of the silicon pillars $5B_1$ and $5B_2$, and are connected to the insulating film 8. The channel portions of the silicon pillars $5B_1$ and $5B_2$, the third and fourth upper diffusion layers 19BA and 19BB, and the second lower diffusion layer 9b are electrically insulated from the second gate electrode 11c by means of the gate insulating films 10 and the insulating film 8.

As illustrated in FIG. 4, the first transistor $50A_1$ disposed in the first active region 1A is formed from the first lower diffusion layer 9a, the first upper diffusion layer 19AA, the gate insulating film 10 and the first gate electrode 11a, and the second transistor $50A_2$ is formed from the first lower diffusion layer 9a, the second upper diffusion layer 19AB, the gate insulating film 10 and the first gate electrode 11a. Further, the third transistor $50B_1$ disposed in the second active region 1B is formed from the second lower diffusion layer 9b, the third upper diffusion layer 19BA, the gate insulating film 10 and the second gate electrode 11c, and the fourth transistor $50B_2$ is formed from the second lower diffusion layer 9b, the fourth upper diffusion layer 19BB, the gate insulating film 10 and the second gate electrode 11c.

A masking film 4 is provided on the element isolation region 2 and the dummy pillar 6. A first interlayer insulating film 12 is provided in such a way as to cover the gate electrodes 11 and the insulating film 8. The first interlayer insulating film 12 is provided filling recessed portions in the pillar groove forming region A. In other words, the first interlayer insulating film 12 is provided in regions enclosed by the wall surfaces of the element isolation region 2 and the masking film 4. A stopper film 21 is provided on the upper surfaces of the masking film 4 and the first interlayer insulating film 12, and further a second interlayer insulating film 20 is provided covering the stopper film 21.

As illustrated in FIG. 2 and FIG. 4, a gate power-feed wiring line 42 is disposed on the upper surface of the second interlayer insulating film 20. The gate power-feed wiring line 42 is connected to the upper surface of the power-feed gate electrode 11b by way of the gate power-feed plug 41 which penetrates through the second interlayer insulating film 20 and the stopper film 21.

Further, as illustrated in FIG. 3 and FIG. 4, the first upper plug wiring line 33A is disposed on the upper surface of the second interlayer insulating film 20. The first upper plug wiring line 33A is connected to the first upper diffusion layer 19AA and the second upper diffusion layer 19AB by way of the first upper contact plug 30A.

The second upper plug wiring line 33B also has the same configuration. In other words, the second upper plug wiring line 33B is connected to the third upper diffusion layer 19BA and the fourth upper diffusion layer 19BB by way of the second upper contact plug 30B.

Further, as illustrated in FIG. 3, the first lower plug wiring line 34A is disposed on the upper surface of the second interlayer insulating film 20. The first lower plug wiring line 34A is connected to the first lower diffusion layer 9a by way of the first lower contact plug 31A, which penetrates through the second interlayer insulating film 20, the stopper film 21, the first interlayer insulating film 12 and the insulating film 8. The first lower diffusion layer 9a is formed from an n-type semiconductor layer in which an n-type impurity such as arsenic or the like is implanted into the semiconductor substrate.

Further, although not shown in the drawings, the second lower plug wiring line 34B is disposed on the upper surface of the second interlayer insulating film 20. The second lower plug wiring line 34B is connected to the second lower diffusion layer 9b by way of the second lower contact plug 31B, which penetrates through the second interlayer insulating film 20, the stopper film 21, the first interlayer insulating film 12 and the insulating film 8. The second lower diffusion layer 9b is formed from an n-type semiconductor layer in which an n-type impurity such as arsenic or the like is implanted into the semiconductor substrate.

Side-wall insulating films 18 and insulating films 17 are disposed on the side surfaces of each silicon plug, and the silicon plugs are electrically insulated from the gate electrodes 11a and 11c by means of the side-wall insulating films 18 and the insulating films 17.

In this way, in the semiconductor device 100 according to the first mode of embodiment, the upper diffusion layers are connected to the upper plug wiring lines 33 by way of the upper contact plugs 30. Here, the upper contact plugs 30 are disposed spanning between the upper surfaces of the upper diffusion layers which are constituents of the transistors, and the upper contact plugs 30 have a configuration in which they are shared by the upper diffusion layers.

By means of such a configuration, even if the position in which an upper contact plug 30 is disposed becomes displaced relative to the upper diffusion layers, the lower surface of the upper contact plug 30, which extends in the direction of deviation, is newly connected to the upper diffusion layer, and therefore the connection surface area between the upper contact plug 30 and the upper diffusion layer can be maintained without decreasing.

In the prior art, individually separated upper contact plugs 30 are disposed with respect to the plurality of silicon plugs 19, and if the positions in which said upper contact plugs 30 are disposed become displaced, a problem arises in that the connection surface area decreases and the characteristics of the semiconductor device 100 become unstable, but this problem can be avoided if the configuration in this mode of embodiment is employed.

(Method of Manufacturing Semiconductor Device)

A method of manufacturing the semiconductor device 100 according to the first mode of embodiment will now be described in detail with reference to FIG. 9 to FIG. 21.

Figure 9:
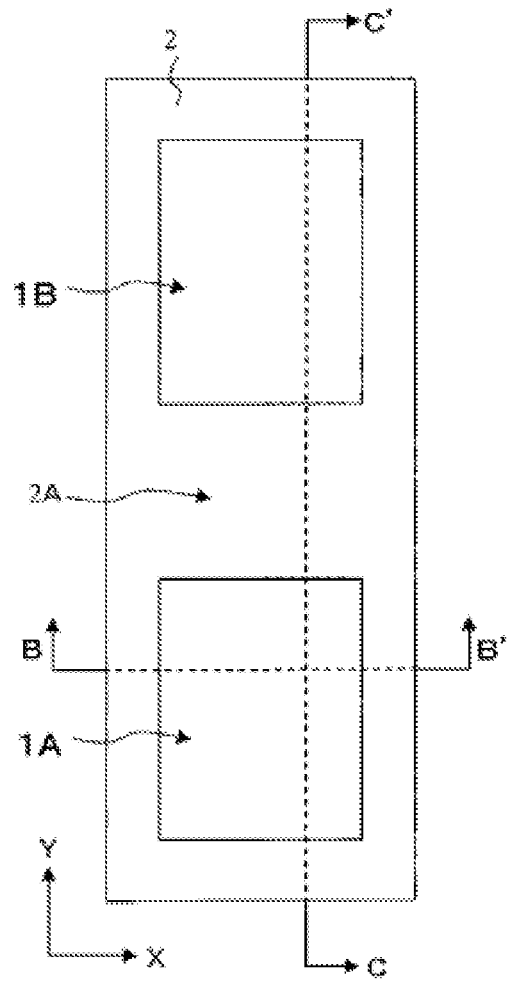
FIG. 9 is a drawing (plan view) illustrating a first step, used to describe a method of manufacturing the semiconductor device according to the first mode of embodiment of the present invention.
Figure 10:
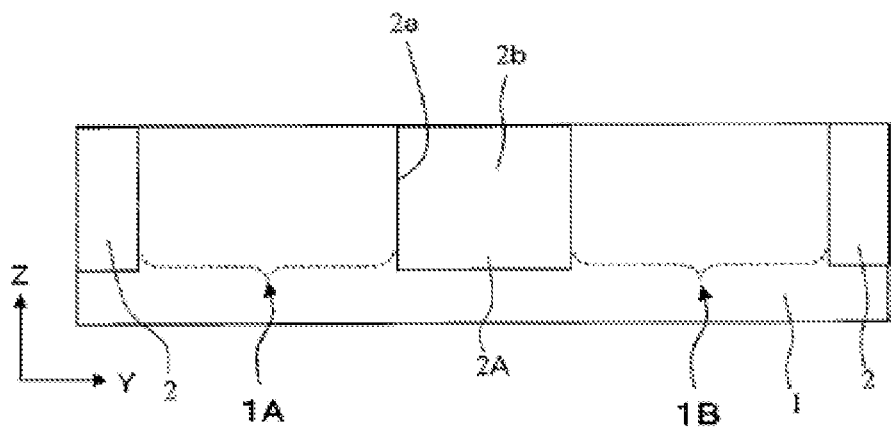
FIG. 10 is a cross-sectional view through the line C-C' in FIG. 9.

As illustrated in FIG. 9 and FIG. 10, grooves 2a are formed in a semiconductor substrate 1 comprising a p-type silicon single crystal, after which an element isolation region 2 is formed using a known STI (Shallow Trench Isolation) method in which the grooves 2a are filled with an insulating film 2b. The depth of the grooves 2a is 250 nm, for example. In this way, a first active region 1A and a second active region 1B are formed adjacent to one another in the Y-direction and enclosed by the STI 2. An intermediate element isolation region 2A forming a portion of the element isolation region 2 is formed between the first active region 1A and the second active region 1B.

Figure 11:
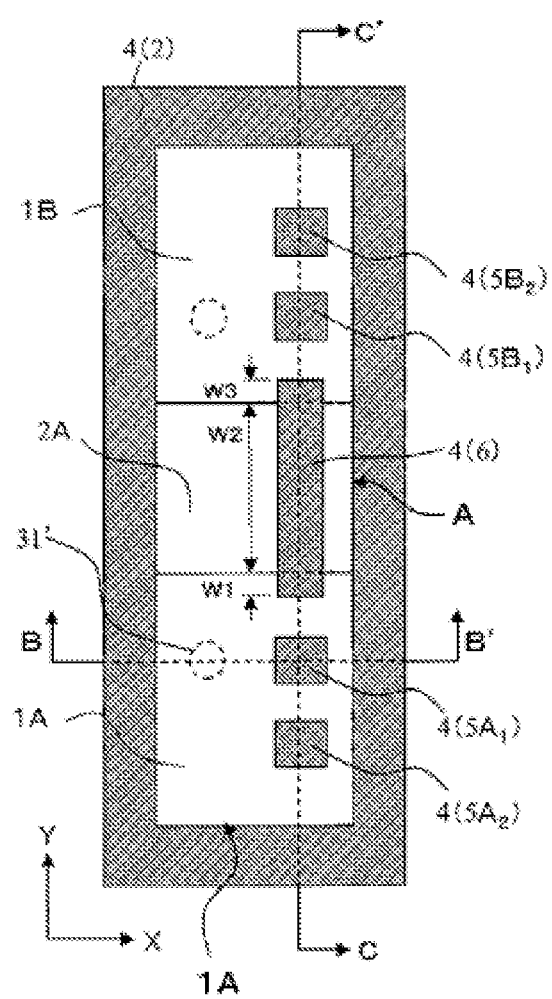
FIG. 11 is a drawing (plan view) illustrating a second step, used to describe the method of manufacturing the semiconductor device according to the first mode of embodiment of the present invention.
Figure 12:
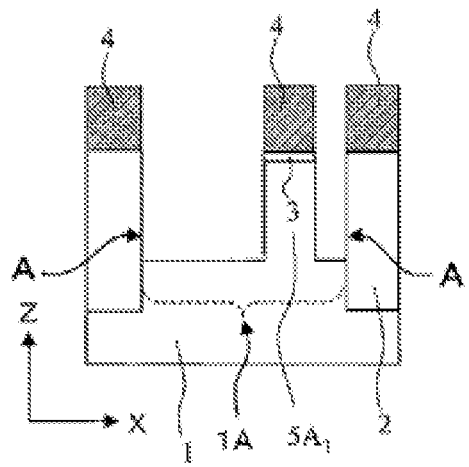
FIG. 12 is a cross-sectional view through the line B-B' in FIG. 11.
Figure 13:
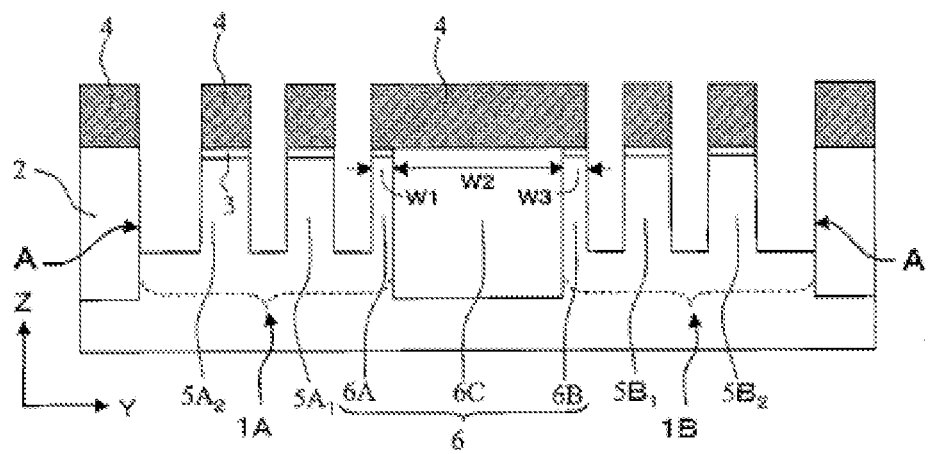
FIG. 13 is a cross-sectional view through the line C-C' in FIG. 11.

Next, as illustrated in FIG. 11 to FIG. 13, a pad insulating film 3 comprising a silicon dioxide film is formed by thermal oxidation to a thickness of 2 nm on the upper surface of the semiconductor substrate 1. A masking film 4 comprising a silicon nitride film is then formed by CVD (Chemical Vapor Deposition) to a thickness of 120 nm. A photoresist mask, which is not shown in the drawings, having an opening pattern in which the entire first active region 1A, second active region 1B and intermediate element isolation region 2A are revealed is formed by photolithography. The opening pattern corresponds to the pillar groove forming region A.

It should be noted that the photoresist may include a hardmask such as an amorphous carbon film. At this time, an island-shaped pattern corresponding to the arrangement of two silicon pillars 5 located in each active region, and an island-shaped pattern corresponding to the arrangement of a dummy pillar 6 which longitudinally traverses the STI 2 in the Y-direction and spans between the first active region 1A and the second active region 1B, are formed in the pillar groove forming region A. The patterns corresponding to each silicon pillar ($5A_1$, $5A_2$ $5B_1$ and $5B_2$) are formed in the shape of a rectangle in which the widths in the X-direction and the Y-direction are each 30 nm. It should be noted that the patterns corresponding to each silicon pillar are not limited to being rectangular, and they may be circles having a diameter of 30 nm.

Further, the respective gaps between the silicon pillars 5 are at most equal to twice the thickness of the gate electrode which is formed later. More specifically, in FIG. 11, the gap between the first silicon pillar $5A_1$ and the second silicon pillar $5A_2$, which are provided in such a way that their respective centers are located on the same line in the Y-direction, is 30 nm. Similarly, the single dummy pillar 6 is disposed in such a way as to be adjacent in the Y-direction to the first silicon pillar $5A_1$, with a gap at most equal to twice the thickness of the gate electrode. Here, the gap between the first silicon pillar $5A_1$ and the dummy pillar 6 is also set to 30 nm.

Next, the pattern is transferred to the masking film 4 and the insulating film 3 by anisotropic dry etching using the photoresist mask. The hardmask including the photoresist is then removed. Next, using the masking film 4 as a mask, the silicon substrate 1 and the STI 2 that have been exposed are excavated by anisotropic dry etching to a depth of 150 nm, to form silicon pillars 5A ($5A_1$ and $5A_2$) and 5B ($5B_1$ and $5B_2$) which form the transistors, and the one dummy pillar 6. Each pillar is formed in such a way as to project upward from the upper surface of the excavated silicon substrate 1 and the upper surface of the excavated STI 2. In this way, the silicon pillars 5 are formed in the shape of rectangles having widths of 30 nm in the X-direction and the Y-direction.

Further, as illustrated in FIG. 13, the dummy pillar 6 is formed as a united first combined pillar in which one side surface of a first dummy silicon pillar 6A provided upright on the first active region 1A side and one side surface of a dummy insulating film pillar 6C provided upright on the STI 2 side are in contact with one another, and is also formed as a united second combined pillar in which one side surface of a second dummy silicon pillar 6B provided upright on the second active region 1B side and one side surface of the dummy insulating film pillar 6C provided upright on the STI 2 side are in contact with one another.

Figure 14:
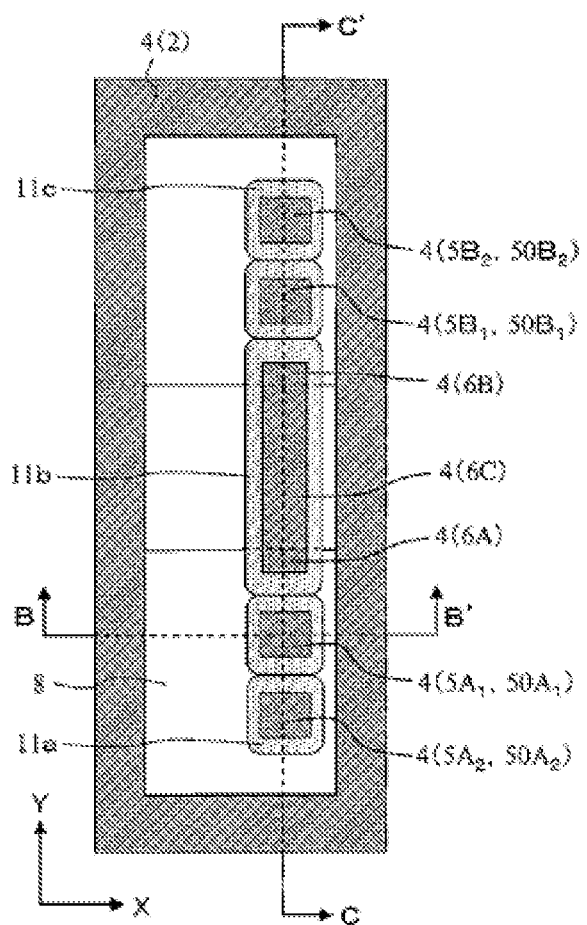
FIG. 14 is a drawing (plan view) illustrating a third step, used to describe the method of manufacturing the semiconductor device according to the first mode of embodiment of the present invention.
Figure 15:
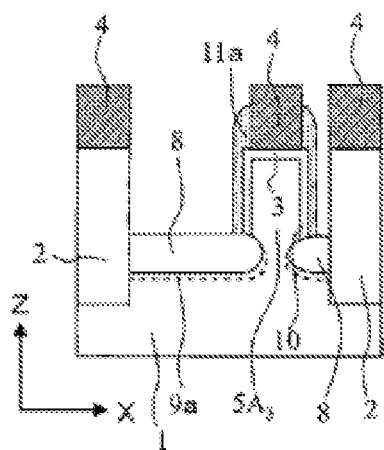
FIG. 15 is a cross-sectional view through the line B-B' in FIG. 14.
Figure 16:
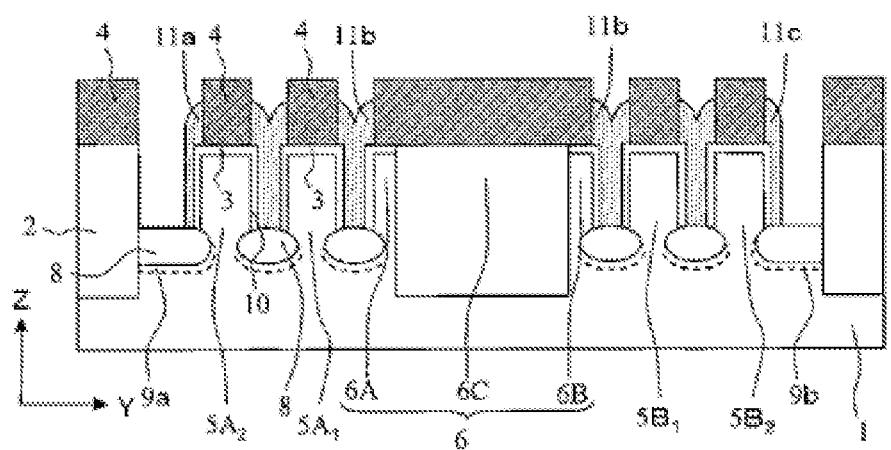
FIG. 16 is a cross-sectional view through the line C-C' in FIG. 14.

Next, as illustrated in FIG. 14 to FIG. 16, the side surfaces of the silicon pillars 5 and the dummy pillar 6 are oxidized by thermal oxidation to a thickness of 1 nm (this is not shown in the drawings), and a silicon nitride film is deposited by CVD to a thickness of 10 nm, after which the entire surface is etched back to form side wall films (which are not shown in the drawings) on the side surfaces of the silicon pillars 5, the dummy pillar 6 and the masking film 4. An insulating film 8 having a thickness of 30 nm is then formed by thermal oxidation on the silicon substrate 1, the upper surface of which has been exposed, located at the periphery of each silicon pillar. At this time, the side surfaces of the silicon pillars 5 and the dummy pillar 6 are not oxidized because they are covered by the side wall films, which are not shown in the drawings.

Next, first and second lower diffusion layers 9a and 9b are formed below the insulating film 8 by ion implantation. The first lower diffusion layer 9a formed in the first active region 1A is shared by the first silicon pillar $5A_1$ and the second silicon pillar $5A_2$ located in the first active region 1A. The second lower diffusion layer 9b formed in the second active region 1B also has the same configuration. In other words, the second lower diffusion layer 9b is shared by the third silicon pillar $5B_1$ and the fourth silicon pillar $5B_2$ located in the second active region 1B. It should be noted that arsenic can, for example, be used as the impurity to be implanted. The first and second lower diffusion layers 9a and 9b are formed as n-type semiconductors. The side wall films and the thermally-oxidized films are then removed.

Next, a gate insulating film 10 comprising a silicon dioxide film having a thickness of 3 nm is formed by thermal oxidation on the side surfaces of the silicon pillars 5 and the dummy pillar 6. Next, an impurity-containing polycrystalline silicon film having a thickness of 20 nm, which will form the gate electrodes, is deposited by CVD over the entire surface of the silicon substrate 1. The entire surface is then etched back by dry etching. In this way, first gate electrodes 11a and second gate electrodes 11c are formed on the side surfaces of the silicon pillars 5, and a power-feed gate electrode 11b is formed on the side surfaces of the dummy pillar 6.

As illustrated in FIG. 16, in the first active region 1A, the gap between the silicon pillars 5A, and the gap between the silicon pillar 5A and the dummy pillar 6 is at most equal to twice the thickness of the gate electrode 11 (30 nm), as discussed hereinabove, and therefore the space between the pillars 5A is completely filled by the first gate electrodes 11a, and the space between the first silicon pillar $5A_1$ and the dummy pillar 6 is completely filled by the first gate electrode 11a and the power-feed gate electrode 11b. Therefore the first gate electrodes 11a on the side surfaces of the first silicon pillar $5A_1$ and the second silicon pillar $5A_2$ are connected together and integrated, and the power-feed gate electrode 11b on the side surface of the dummy pillar 6 is connected to the first gate electrode 11a on the side surface of the first silicon pillar $5A_1$.

The second gate electrodes 11c formed in the second active region 1B also have the same configuration. In other words, the space between the pillars 5B is completely filled by the second gate electrodes 11c, and the space between the third silicon pillar $5B_1$ and the dummy pillar 6 is completely filled by the second gate electrode 11c and the power-feed gate electrode 11b. Therefore the second gate electrodes 11c on the side surfaces of the third silicon pillar $5B_1$ and the fourth silicon pillar $5B_2$ are connected together and integrated, and the power-feed gate electrode 11b on the side surface of the dummy pillar 6 is connected to the second gate electrode 11c on the side surface of the third silicon pillar $5B_1$.

Figure 17:
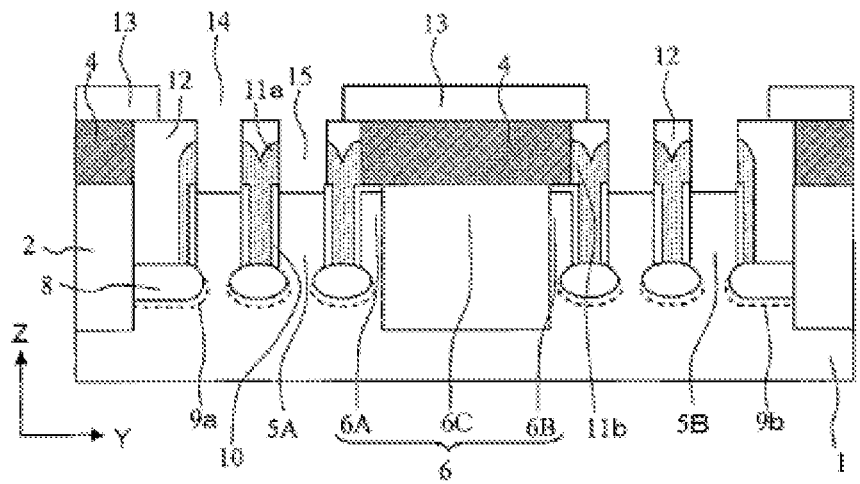
FIG. 17 is a drawing (cross-sectional view through the line C-C') illustrating a fourth step, used to describe the method of manufacturing the semiconductor device according to the first mode of embodiment of the present invention.

Next, as illustrated in FIG. 17, a first interlayer insulating film 12 comprising a silicon dioxide film is formed by CVD in such a way as to embed the silicon pillars 5 and the dummy pillar 6. The first interlayer insulating film 12 is then planarized by CMP (Chemical Mechanical Polishing) in such a way as to expose the masking film 4. A masking film 13 comprising a silicon dioxide film is next deposited by CVD to a thickness of 50 nm.

Next, a portion of the masking film 13 is removed by photolithography and etching to form first opening portions 14. The first opening portions 14 are formed in such a way that at least the upper surfaces of the plurality of silicon pillars formed in one active region are revealed collectively. The masking films 4 located on the silicon pillars 5 are exposed in the first opening portions 14. The exposed masking film 4 is then removed selectively by wet etching, and the insulating film 3 is additionally removed to form second opening portions 15 above the silicon pillars 5. The upper surfaces of the silicon pillars 5 are exposed at the bottom surfaces of the second opening portions 15, and portions of the gate electrodes 11a and 11c are exposed at the side surfaces thereof.

Figure 18:
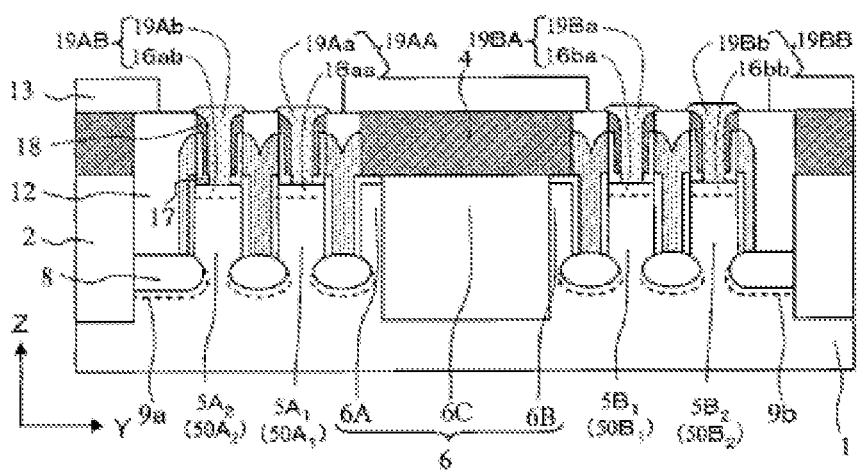
FIG. 18 is a drawing (cross-sectional view through the line C-C') illustrating a fifth step, used to describe the method of manufacturing the semiconductor device according to the first mode of embodiment of the present invention.

Next, as illustrated in FIG. 18, insulating films 17 comprising silicon dioxide films are formed by thermal oxidation on the inner walls of the second opening portions 15. An impurity (phosphorus or arsenic, for example) is then implanted by ion implantation from the second opening portions 15 into upper portions of the silicon pillars 5 to form n-type diffusion layers 16. Further, CVD is used to deposit a silicon nitride film to a thickness of 10 nm on the inner walls of the second opening portions 15, after which etch-back is performed to form side wall films 18.

When the side wall films 18 are being formed, the insulating films 17 that were formed on the upper surfaces of the silicon pillars 5 are also removed to expose the upper surfaces of the silicon pillars 5. At this time, the insulating films 17 remain below the side wall films 18 and on the exposed surfaces of the gate electrodes 11 in the second opening portions 15. The side wall films 18 fulfill the role of maintaining insulation between the gate electrodes 11 and silicon plugs which are formed later.

Next, using selective epitaxial growth, silicon plugs are grown onto the upper surfaces of the silicon pillars 5 in such a way as to fill the second opening portions 15. Ions such as arsenic are then implanted into the silicon plugs 19 to form silicon plugs comprising an n-type semiconductor, on the diffusion layers 16.

In this way, a first upper diffusion layer 19AA in which the first diffusion layer 16aa and a first silicon plug 19Aa are integrated is formed at the top of the first silicon pillar $5A_1$. Similarly, a second upper diffusion layer 19AB is formed at the top of the second silicon pillar $5A_2$, a third upper diffusion layer 19BA is formed at the top of the third silicon pillar 5B, and a fourth upper diffusion layer 19BB is formed at the top of the fourth silicon pillar $5B_2$.

Figure 19:
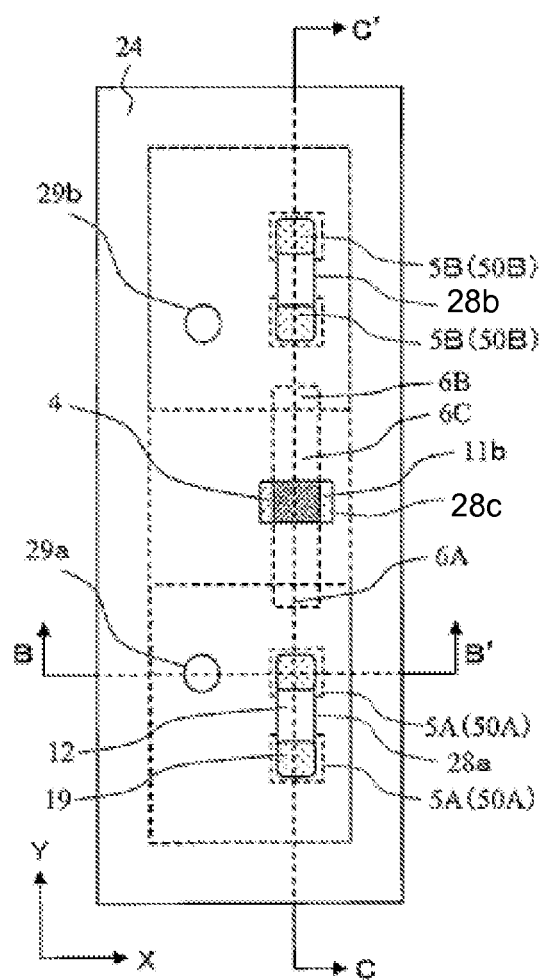
FIG. 19 is a drawing (plan view) illustrating a sixth step, used to describe the method of manufacturing the semiconductor device according to the first mode of embodiment of the present invention.
Figure 20:
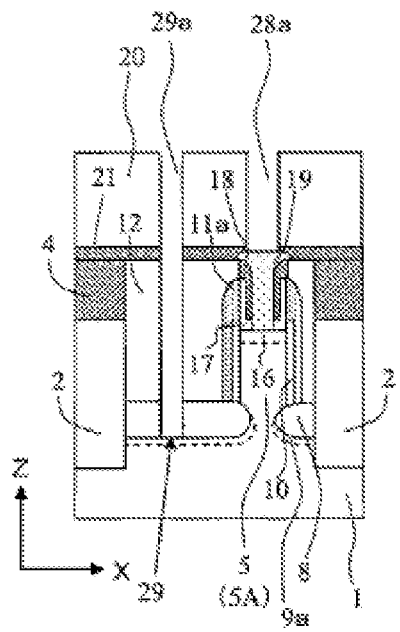
FIG. 20 is a cross-sectional view through the line B-B' in FIG. 19.
Figure 21:
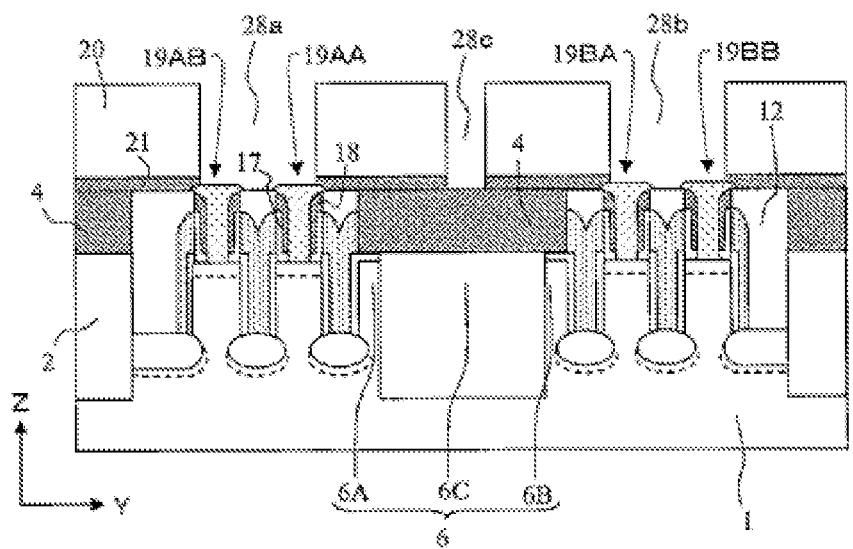
FIG. 21 is a cross-sectional view through the line C-C' in FIG. 19.

Next, as illustrated in FIG. 19 to FIG. 21, a silicon dioxide film is formed by CVD in such a way as to fill the first opening portion 14, after which the silicon dioxide film and the masking film 13 are planarized by CMP in such a way as to expose the masking film 4. Next, a stopper film 21 comprising a silicon nitride film, and a second interlayer insulating film 20 comprising a silicon dioxide film are successively formed by CVD in such a way as to cover the upper surfaces of the first interlayer insulating film 12 and the masking film 4.

Next, photolithography and dry etching are used to form first, second and third contact holes 28a, 28b and 28c, and fourth and fifth contact holes 29a and 29b.

It should be noted that the first and second contact holes 28a and 28b are also called first and second upper contact holes respectively, the third contact hole 28c is also called a gate contact hole, and the fourth and fifth contact holes 29a and 29b are also called first and second lower contact holes respectively.

The first contact hole 28a formed in the first active region 1A is formed as an enlarged rectangle, in such a way as to expose collectively the upper surfaces of the first upper diffusion layer 19AA and the second upper diffusion layer 19AB. In this way, by forming the first contact hole 28a in such a way as to expose collectively the upper surfaces of the plurality of upper diffusion layers, it is possible to expose the upper surfaces of the two upper diffusion layers in the lower surface of the first contact hole 28a, even if the position in which the first contact hole 28a is formed becomes displaced relative to the upper diffusion layers 19AA and 19AB.

The second contact hole 28b formed in the second active region 1B also has the same configuration. In other words, the second contact hole 28b is formed as an enlarged rectangle, in such a way as to expose collectively the upper surfaces of the third upper diffusion layer 19BA and the fourth upper diffusion layer 19BB. In this way, by forming the second contact hole 28b in such a way as to expose collectively the upper surfaces of the plurality of upper diffusion layers, it is possible to expose the upper surfaces of the two upper diffusion layers in the lower surface of the second contact hole 28b, even if the position in which the second contact hole 28b is formed becomes displaced relative to the upper diffusion layers 19BA and 19BB.

When the third contact hole 28c, formed in the intermediate element isolation region 2A, is being formed, the upper surface of the dummy pillar 6 is protected by the remaining masking film 4, and is therefore not etched. The third contact hole 28c is formed in such a way as to protrude out from the end portions, in the X-direction, of the dummy insulating film pillar 6C, and therefore the masking film 4 formed above the dummy insulating film pillar 6C, and portions of the power-feed gate electrode 11b formed on the side surfaces of the dummy insulating film pillar 6C are exposed at the bottom surface of the third contact hole 28c.

Further, as illustrated in FIG. 20, a portion of the first lower diffusion layer 9a is exposed in a lower portion of the fourth contact hole 29a formed above the first lower diffusion layer 9a in the first active region 1A. Similarly, although not shown in the drawings, a portion of the second lower diffusion layer 9b is exposed in a lower portion of the fifth contact hole 29b formed above the second lower diffusion layer 9b in the second active region 1B. The contact holes 28 and 29 may be formed simultaneously, or may be formed separately.

Next, as illustrated in FIG. 1 to FIG. 4, a metal film formed from tungsten (W), titanium nitride (TiN) and titanium (Ti) is deposited by CVD in such a way as to cover the second interlayer insulating film 20, thereby filling the interiors of the first to fifth contact holes 28a, 28b, 28c, 29a and 29b. The metal film remaining on the upper surface of the second interlayer insulating film 20 is next removed by CMP, such that the metal film remains only inside the first to fifth contact holes 28a, 28b, 28c, 29a and 29b.

In this way, a first upper contact plug 30A connected to the first upper diffusion layer 19AA and the second upper diffusion layer 19AB is formed in the first contact hole 28a, and a second upper contact plug 30B connected to the third upper diffusion layer 19BA and the fourth upper diffusion layer 19BB is formed in the second contact hole 28b. Further, a gate power-feed plug 41 connected to the power-feed gate electrode 11b is formed in the third contact hole 28c. Further, a first lower contact plug 31A connected to the first lower diffusion layer 9a is formed in the fourth contact hole 29a, and a second lower contact plug 31B connected to the second lower diffusion layer 9b is formed in the fifth contact hole 29b.

Next, a metal film formed from tungsten (W) and tungsten nitride (WN) is formed over the entire surface by sputtering. The metal film is next patterned by lithography and dry etching, to form various wiring lines. In this way, a first upper plug wiring line 33A connected to the first upper contact plug 30A, a second upper plug wiring line 33B connected to the second upper contact plug 30B, a first lower plug wiring line 34A connected to the first lower contact plug 31A, a second lower plug wiring line 34B connected to the second lower contact plug 31B, and a gate power-feed wiring line 42 connected to the gate power-feed plug 41 are formed simultaneously.

By adopting the method of manufacture described hereinabove, it is possible to form two parallel transistors which share a gate electrode, and in which the upper diffusion layers of the plurality of vertical transistors disposed in each of the two active regions are connected to one another by means of one contact plug which is in contact with each of said upper diffusion layers.

According to the method of manufacturing a semiconductor device in this mode of embodiment, rather than disposing individual upper contact holes with respect to each upper diffusion layer, an enlarged contact hole is disposed exposing collectively a plurality of upper diffusion layers, and it is therefore possible to maintain the ease with which the contact holes are formed, by avoiding the influence of optical proximity effects when lithography is performed. Further, the contact hole comprises a collective opening, and therefore even if the position of the contact hole becomes displaced, the connection surface area between the upper diffusion layers and the contact plug can be ensured, alleviating a reduction in the connection surface area, and therefore the characteristics of the vertical transistors can be stabilized.

[Second Mode of Embodiment]

In the first mode of embodiment, the upper contact plugs 30 are extended in the direction in which the vertical transistors 50 are arranged, after which the metal wiring lines (upper plug wiring lines) 33 are disposed on the upper surfaces thereof, but the arrangement of the metal contact plugs (upper contact plugs) 30 and the configuration of the connection between the metal contact plugs 30 and the metal wiring lines 33 can be modified in various ways, and will therefore now be described in detail.

The description omits content that is common with the first mode of embodiment, and only the points of difference are described, with reference to FIG. 5 to FIG. 8. It should be noted that the method of manufacturing the semiconductor device 200 according to the second mode of embodiment is similar to the method of manufacturing the semiconductor device 100 according to the first mode of embodiment, and a description thereof is thus omitted.

Figure 5:
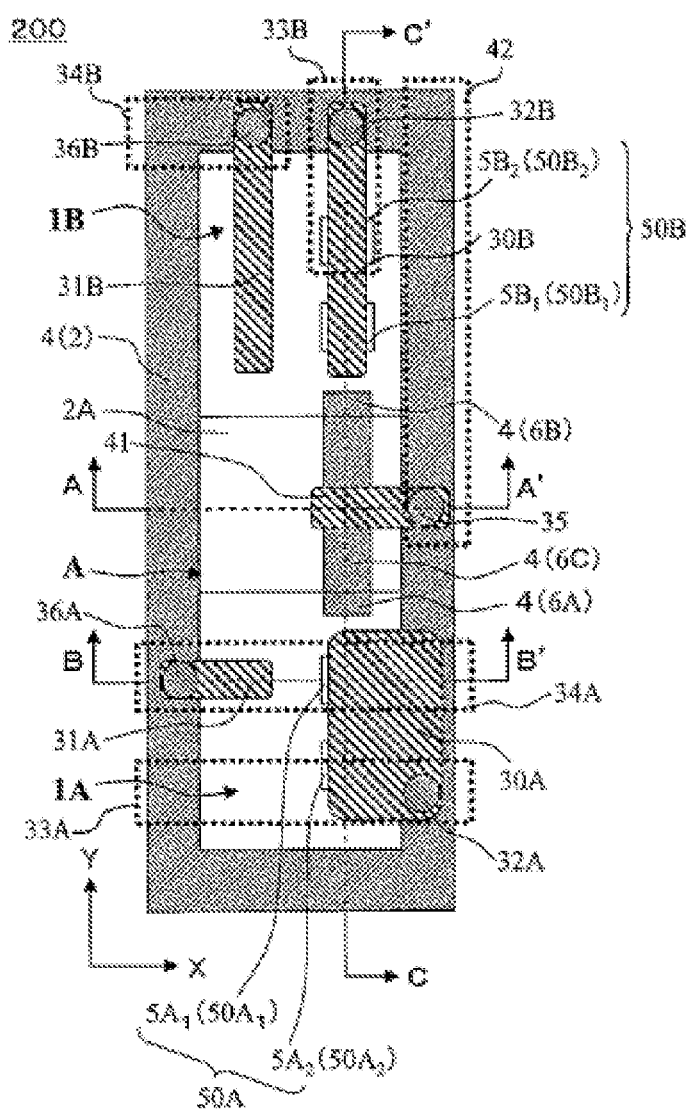
FIG. 5 is a schematic diagram (plan view) illustrating the structure of a semiconductor device according to a second mode of embodiment of the present invention.

First, as illustrated in FIG. 5, a single first upper contact plug 30A is disposed in a position shared by and overlapping the transistors 50A$_1$ and 50A$_2$. The first upper contact plug 30A extends in the Y-direction, the direction in which the two transistors are arranged, and is widened in the X-direction such that it is also disposed above a portion of the element isolation region 2. Further, the second upper contact plug 30B is extended in the Y-direction, the direction in which the two transistors 50B$_1$ and 50B$_2$ are arranged, and is also disposed above a portion of the element isolation region 2. The first upper plug wiring line 33A is connected to the first upper diffusion layer 19AA and the second upper diffusion layer 19AB, which are constituents of the transistors, by way of the first upper contact plug 30A and a third upper contact plug 32A.

Here, the third upper contact plug 32A is disposed in a position in which the element isolation region 2 and the first upper contact plug 30A overlap. It should be noted that the first upper plug wiring line 33A in the first active region 1A extends in the X-direction, and the second upper plug wiring line 33B in the second active region 1B extends in the Y-direction.

Figure 6:
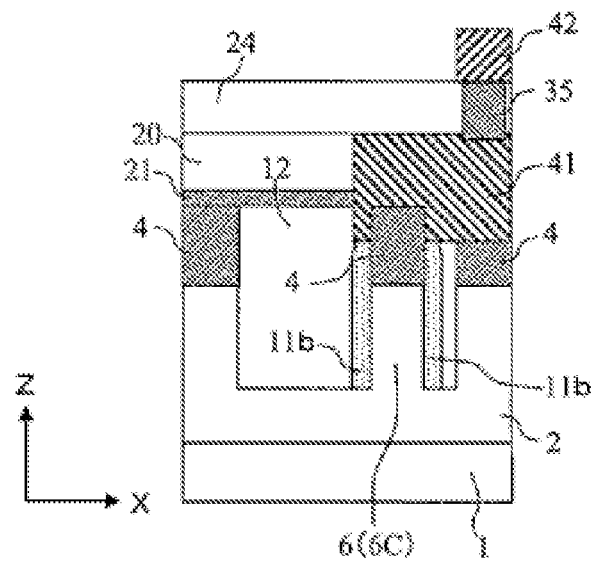
FIG. 6 is a cross-sectional view through the line A-A' in FIG. 5.

As illustrated in FIG. 5 and FIG. 6, the gate power-feed wiring line 42 is disposed on the upper surface of a third interlayer insulating film 24. The gate power-feed wiring line 42 is connected to the power-feed gate electrode 11b by way of the gate power-feed plug 41 which penetrates through the second interlayer insulating film 20, the stopper film 21 and the first interlayer insulating film 12, and a second gate power-feed plug 35 which penetrates through the third interlayer insulating film 24. Here, the second gate power-feed plug 35 and the gate power-feed wiring line 42 are disposed in positions overlapping the element isolation region 2.

Figure 7:
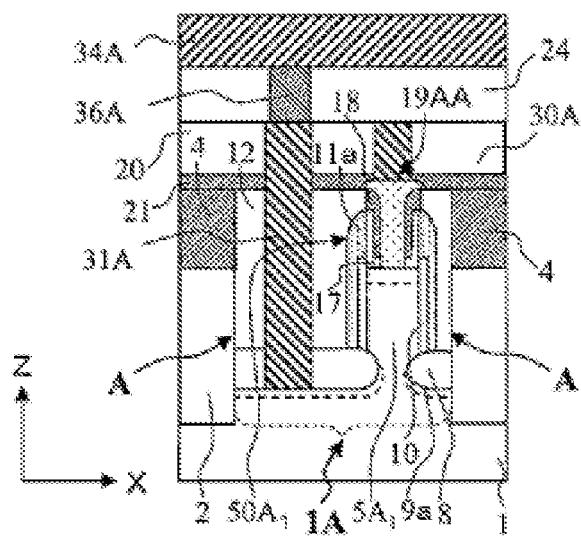
FIG. 7 is a cross-sectional view through the line B-B' in FIG. 5.
Figure 8:
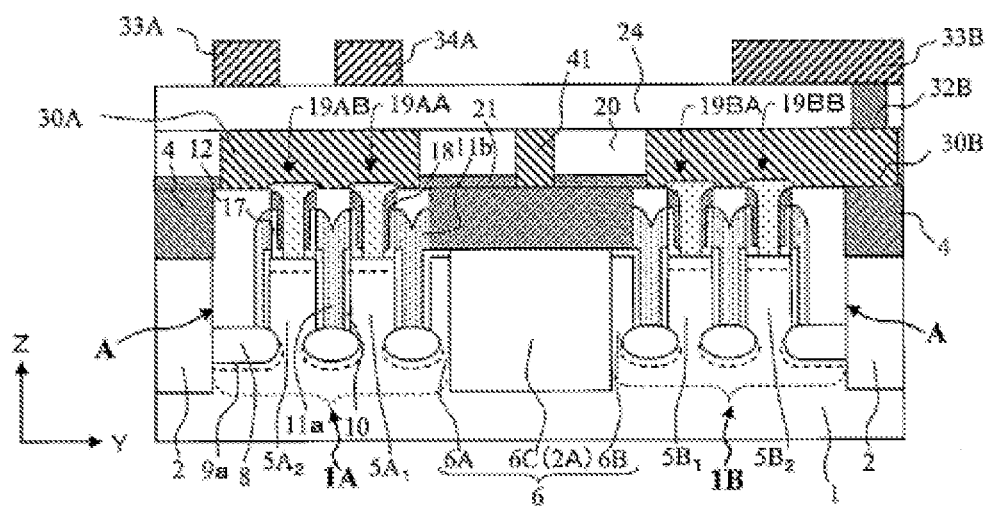
FIG. 8 is a cross-sectional view through the line C-C' in FIG. 5.

As illustrated in FIG. 7 and FIG. 8, the first upper plug wiring line 33A and the first lower plug wiring line 34A are disposed on the upper surface of the third interlayer insulating film 24. The first upper plug wiring line 33A is connected to the first upper diffusion layer 19AA located at the top of the first transistor 50A$_1$, and the second upper diffusion layer 19AB located at the top of the second transistor 50A$_2$, by way of the first upper contact plug 30A, which penetrates through the second interlayer insulating film 20 and the stopper film 21, and the third upper contact plug 32A, which penetrates through the third interlayer insulating film 24. The first lower plug wiring line 34A is connected to the first lower diffusion layer 9a by way of the first lower contact plug 31A, which penetrates through the second interlayer insulating film 20, the stopper film 21, the first interlayer insulating film 12 and the insulating film 8, and a third lower contact plug 36A, which penetrates through the third interlayer insulating film 24.

It should be noted that the first lower contact plug 31A extends to one side in the X-direction, and is disposed in a position overlapping the element isolation region 2, and the second lower contact plug 31B extends to one side in the Y-direction, and is disposed in a position overlapping the element isolation region 2. Further, the third lower contact plug 36A is disposed in a position in which the element isolation region 2 and the first lower contact plug 31A overlap. The fourth lower contact plug 36B is disposed in a position in which the element isolation region 2 and the second lower contact plug 31B overlap.

Thus, in the semiconductor device 200 according to the second mode of embodiment, the first upper diffusion layer 19AA and the second upper diffusion layer 19AB are connected to the first upper plug wiring line 33A by way of the first upper contact plug 30A and the third upper contact plug 32A.

Further, the third upper diffusion layer 19BA and the fourth upper diffusion layer 19BB are connected to the second upper plug wiring line 33B by way of the second upper contact plug 30B and the fourth upper contact plug 32B. Here, the upper contact plugs 30A and 30B are disposed covering the upper surfaces of the plurality of upper diffusion layers in the plurality of transistors, and extending above a portion of the element isolation region 2, and the upper contact plugs 30A and 30B have a configuration in which they are shared by the respective upper diffusion layers.

By adopting such a configuration, the same advantages as in the first mode of embodiment can be obtained, in addition to which, by suitably disposing the third and fourth upper contact plugs 32A and 32B on the upper surfaces of the first and second upper contact plugs 30A and 30B which have been extended above the element isolation region 2, the area over which the first and second upper plug wiring lines 33A and 33B are disposed can be enlarged, and the degree of freedom in terms of layout design can be improved.

[Third Mode of Embodiment]

In the first mode of embodiment and the second mode of embodiment, descriptions were provided of configurations in which the upper diffusion layers of a plurality of vertical transistors disposed in one active region are connected to one contact plug.

Figure 22:
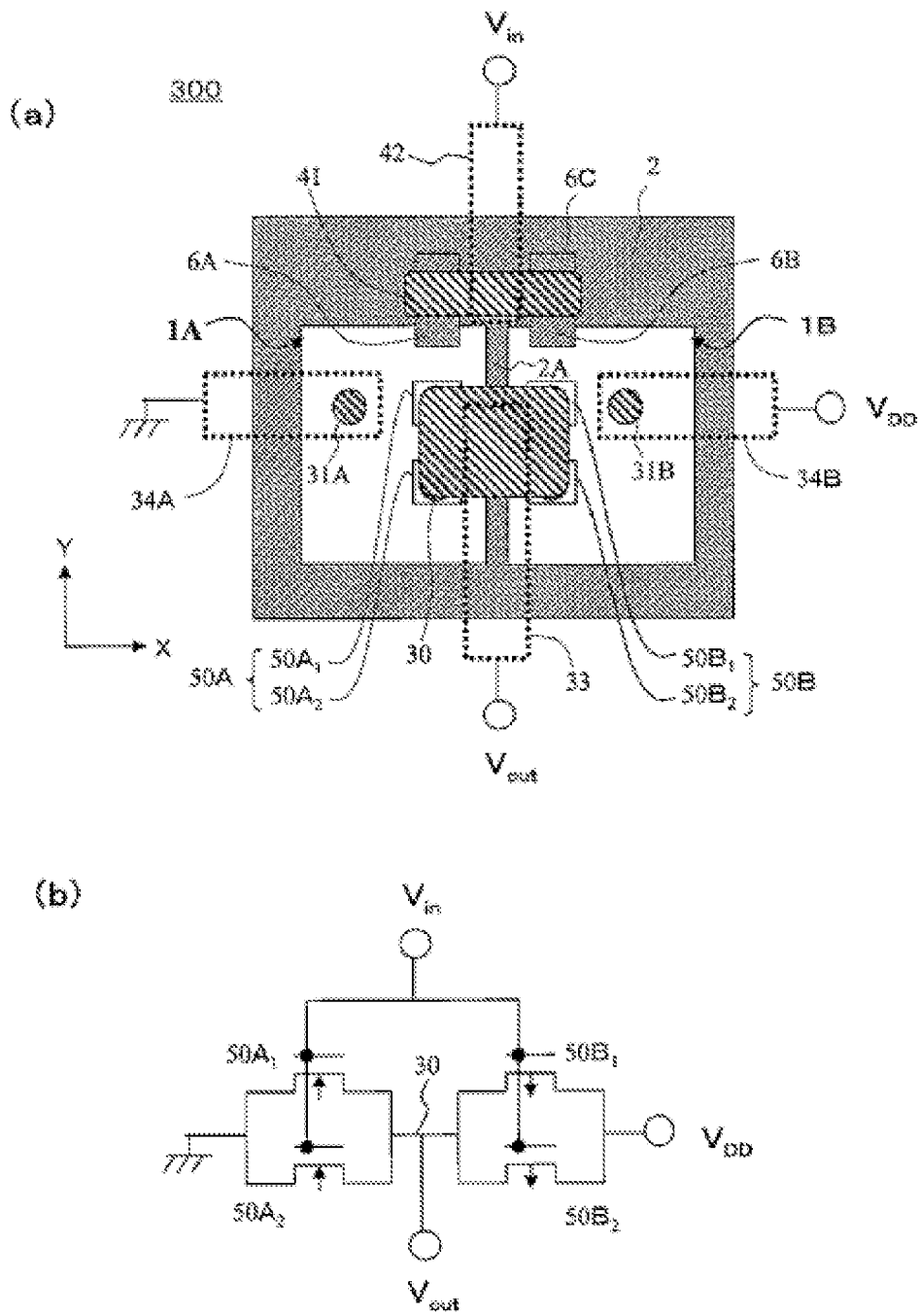
FIG. 22 is a drawing used to describe the configuration of a semiconductor device according to third and fourth modes of embodiment of the present invention, where (a) is plan view and (b) is an equivalent circuit diagram.

In the third mode of embodiment, a configuration is described, with reference to FIG. 22, in which the upper diffusion layers of a plurality of vertical transistors disposed in two active regions that are adjacent to one another with the interposition of an element isolation region are connected to one another by means of a single upper contact plug disposed straddling the element isolation region. The basic configuration of the cross section is the same as in FIG. 4, and a description of a cross-sectional view is therefore omitted. FIG. 22 (a) is a plan view illustrating one example of the layout of a semiconductor device 300 according to the third mode of embodiment of the present invention, and FIG. 22 (b) is an equivalent circuit diagram of FIG. 22 (a).

It should be noted that in FIG. 22 (a), in contrast to the first and second modes of embodiment, the X-direction is referred to as the first direction, and the Y-direction is referred to as the second direction.

Reference is first made to FIG. 22 (a). A first active region 1A and a second active region 1B are disposed adjacent to one another in the X-direction (first direction) with the interposition of an element isolation region 2, on a semiconductor substrate comprising p-type single-crystal silicon. An intermediate element isolation region 2A is disposed between the first and second active regions 1A and 1B. A first transistor 50A$_1$ and a second transistor 50A$_2$, each comprising vertical transistors, are disposed adjacent to one another in the Y-direction (second direction) in the first active region 1A. The first lower diffusion layer 9a illustrated in FIG. 4 is disposed on the upper surface of the first active region 1A in which the first and second transistors 50A$_1$ and 50A$_2$ are not disposed. The first lower diffusion layer 9a is connected to a first lower plug wiring line 34A in an upper layer by way of a first lower contact plug 31A which is connected to the upper surface of the first lower diffusion layer 9a.

In the same way as in FIG. 4 in the first mode of embodiment, the first transistor 50A$_1$ and the second transistor 50A$_2$ are provided with first gate electrodes 11a disposed on the side surfaces of silicon pillars 5A$_1$ and 5A$_2$, with the interposition of a gate insulating film 10. The first gate electrodes 11a are disposed in a continuum as far as the periphery of a first dummy silicon pillar 6A, and are connected to a gate power-feed plug 41. Further, the first transistor 50A$_1$ and the second transistor 50A$_2$ are provided respectively with a first upper diffusion layer 19AA and a second upper diffusion layer 19AB, as illustrated in FIG. 4.

Meanwhile, a third transistor 50B$_1$ and a fourth transistor 50B$_2$, each comprising vertical transistors, are disposed adjacent to one another in the Y-direction (second direction) in the second active region 1B. Further, the third transistor 50B$_1$ and the fourth transistor 50B$_2$ are disposed adjacent, in the X-direction (first direction), to the first transistor 50A$_1$ and the second transistor 50A$_2$ respectively, in such a way as to face the first transistor 50A$_1$ and the second transistor 50A$_2$ respectively across the element isolation region 2.

Other aspects of the configuration are the same as in the first active region 1A.

To elaborate, the second lower diffusion layer 9b illustrated in FIG. 4 is disposed on the upper surface of the second active region 1B in which the third and fourth transistors 50B$_1$ and 50B$_2$ are not disposed. The second lower diffusion layer 9b is connected to a second lower plug wiring line 34B in an upper layer by way of a second lower contact plug 31B which is connected to the upper surface of the second lower diffusion layer 9b.

In the same way as in FIG. 4 in the first mode of embodiment, the third transistor 50B$_1$ and the fourth transistor 50B$_2$ are provided with second gate electrodes 11c disposed on the side surfaces of silicon pillars 5B$_1$ and 5B$_2$, with the interposition of the gate insulating film 10. The second gate electrodes 11c are disposed in a continuum as far as the periphery of a second dummy silicon pillar 6B, and are connected to the gate power-feed plug 41. Further, the third transistor 50B$_1$ and the fourth transistor 50B$_2$ are provided respectively with a third upper diffusion layer 19BA and a fourth upper diffusion layer 19BB, as illustrated in FIG. 4.

By adopting the configuration described hereinabove, the upper diffusion layers 19AA, 19AB, 19BA and 19BB of the first to fourth transistors 50A$_1$, 50A$_2$, 50B$_1$ and 50B$_2$ disposed isolated from one another are connected together collectively by means of a single upper contact plug 30 which fills a single upper contact hole (which is not shown in the drawings). By disposing the upper contact plug 30 spanning between the first active region 1A and the second active region 1B, which are isolated from one other with the interposition of the element isolation region 2, the first transistor 50A$_1$ and the second transistor 50A$_2$ form a single first parallel transistor 50A located in the first active region 1A, and the third transistor 50B$_1$ and the fourth transistor 50B$_2$ form a single second parallel transistor 50B located in the second active region 1B. The gate power-feed plug 41 has a configuration in which it is shared by the two parallel transistors 50A and 50B, and the gate power-feed plug 41 is connected to the gate power-feed wiring line 42 in an upper layer.

The configuration is therefore such that the first lower plug wiring line 34A, the first lower contact plug 31A, the first lower diffusion layer 9a, the first parallel transistor 50A, the upper contact plug 30, the second parallel transistor 50B, the second lower diffusion layer 9b, the second lower contact plug 31B and the second lower plug wiring line 34B are successively connected in series. In other words, a single series-parallel transistor is formed, wherein the two parallel transistors 50A and 50B disposed in different active regions are connected in series. In this way it is possible to obtain a high-current, high-breakdown voltage transistor.

It should be noted that in FIG. 22 (a), two vertical transistors are disposed in each active region, but the present invention is not limited to this configuration, and it is also possible to dispose a larger number of vertical transistors.

[Fourth Mode of Embodiment]

In the fourth mode of embodiment a description will be provided of a C-MOS inverter circuit formed on the basis of the configuration in the third mode of embodiment, with the addition of an upper plug wiring line 33 connected to the upper surface of the upper contact plug 30.

The configuration will first be described with reference to FIG. 22 (a). The semiconductor substrate is formed from a semiconductor comprising a p-type silicon single crystal, and therefore the first active region 1A is formed from a p-type semiconductor region, using the semiconductor substrate without modification. In this way, the first transistor 50A$_1$ and the second transistor 50A$_2$ are formed as n-channel transistors. In other words, the first upper diffusion layer 19AA, the second upper diffusion layer 19AB and the shared first lower diffusion layer 9a are all formed from n-type diffusion layers.

It should be noted that p-type is also referred to as a first conduction type, and n-type is also referred to as a second conduction type.

Meanwhile, the second active region 1B is formed from an n-type semiconductor region. The n-type semiconductor region can be formed using a known n-well forming method in which an n-type impurity is introduced by ion implantation. In this way, the third transistor 50B$_1$ and the fourth transistor 50B$_2$ are formed as p-channel transistors. In other words, the third upper diffusion layer 19BA, the fourth upper diffusion layer 19BB and the shared second lower diffusion layer 9b are all formed from p-type diffusion layers. The first gate electrode 11a and the second gate electrode 11c are each formed from metal films such as titanium nitride (TiN) formed by CVD.

In the fourth mode of embodiment, a connection terminal to the upper contact plug 30 is required. Here, the upper plug wiring line 33 is disposed connected to the upper surface of the upper contact plug 30.

In the abovementioned configuration, in a state in which a ground potential or a relatively low voltage is being applied to the first lower plug wiring line 34A, a power supply voltage or a relatively high positive voltage $V_{DD}$ is applied to the second lower plug wiring line 34B, and a prescribed voltage Vin is applied to the gate power-feed wiring line 42. By this means, a voltage Vout which is lower than Vin is output to the upper plug wiring line 33 connected to the upper contact plug 30. In other words, by disposing a p-channel transistor on the side to which $V_{DD}$ is applied, and disposing an n-channel transistor on the ground side, and by connecting the p-channel transistor to the n-channel transistor and applying the same voltage to the first gate electrode 11a and the second gate electrode 11c, it is possible to configure an inverter circuit in which an output voltage Vout which is inverted relative to the input gate voltage Vin is obtained.

In other words, when Vin is 'high', 'low' is output to Vout, and when Vin is 'low', 'high' is output to Vout.

FIG. 22 (b) is an equivalent circuit diagram of the abovementioned configuration. The second parallel transistor 50B comprising two p-channel transistors is disposed on the $V_{DD}$ side, and the first parallel transistor 50A comprising two n-channel transistors is disposed on the ground side. The configuration is such that the same input voltage Vin is applied to both the first gate electrode 11a and the second gate electrode 11c.

In FIG. 22 (a), only a single-stage inverter circuit is illustrated, but a multi-stage inverter circuit may also be formed by means of a repeating arrangement.

As described hereinabove, according to the fourth mode of embodiment, an inverter circuit can be configured by forming the upper contact plug 30 as a collective enlarged contact plug spanning the plurality of upper diffusion layers.

Preferred modes of embodiment of the present invention have been described hereinabove, but various modifications to the present invention may be made without deviating from the gist of the present invention, without limitation to the abovementioned mode of embodiment, and it goes without saying that these are also included within the scope of the present invention. For example, in the modes of embodiment a silicon substrate was used as an example of a semiconductor substrate, but semiconductor substrate base pillars can also be formed in a substrate other than a silicon substrate. Further, it is also possible to form a semiconductor layer on an insulating substrate such as a glass substrate, and to etch the semiconductor layer to form semiconductor base pillars and protruding layers. Further, the layouts of the conductive plugs, silicon plugs and wiring lines are examples, and can be modified freely in accordance with design requirements.

This application is based upon and claims the benefit of priority from Japanese Patent Application No. 2013-100429, filed on May 10, 2013, the entire disclosure of which is incorporated herein by reference.

EXPLANATION OF THE REFERENCE CODES

1 Silicon substrate (silicon substrate)
1A First active region
1B Second active region
2 Element isolation region (STI)
2a Groove
2b Insulating film
2A Intermediate element isolation region
3 Pad insulating film
4 Masking film
5 Silicon pillar
5A Silicon pillar
$5A_1$ First silicon pillar
$5A_2$ Second silicon pillar
$5B_1$ Third silicon pillar
$5B_2$ Fourth silicon pillar
6 Dummy pillar
6A First dummy silicon pillar
6B Second dummy silicon pillar
6C Dummy insulating film pillar
8 Insulating film
9a First lower diffusion layer
9b Second lower diffusion layer
10 Gate insulating film
11a First gate electrode
11b Power-feed gate electrode
11c Second gate electrode
12 First interlayer insulating film
13 Masking film
14 First opening portion
15 Second opening portion
16aa First diffusion layer
16ab Second diffusion layer
16ba Third diffusion layer
16bb Fourth diffusion layer
17 Insulating film
18 Side wall film
19Aa First silicon plug
19AA First upper diffusion layer
19Ab Second silicon plug
19AB Second upper diffusion layer
19Ba Third silicon plug
19BA Third upper diffusion layer
19Bb Fourth silicon plug
19BB Fourth upper diffusion layer
20 Second interlayer insulating film
21 Stopper film
24 Third interlayer insulating film
28a First contact hole (first upper contact hole)
28b Second contact hole (second upper contact hole)
28c Third contact hole (gate contact hole)
29a Fourth contact hole (first lower contact hole)
29b Fifth contact hole (second lower contact hole)
30 Upper contact plug
30A First upper diffusion layer contact plug (first upper contact plug)
30B Second upper diffusion layer contact plug (second upper contact plug)
31A First lower diffusion layer contact plug (first lower contact plug)
31B Second lower diffusion layer contact plug (second lower contact plug)
32A Third upper contact plug
32B Fourth upper contact plug
33 Upper plug wiring line (metal wiring line)
33A First upper plug wiring line
33B Second upper plug wiring line
34A First lower plug wiring line
34B Second lower plug wiring line
35 Second gate power-feed plug
36A Third lower contact plug
36B Fourth lower contact plug
41 Gate power-feed contact plug (gate power-feed plug)
42 Gate power-feed wiring line
50A First parallel transistor
$50A_1$ First transistor
$50A_2$ Second transistor
50B Second parallel transistor
$50B_1$ Third transistor
$50B_2$ Fourth transistor
100 Semiconductor device
200 Semiconductor device
300 Semiconductor device
A Pillar groove forming region
X X-direction (second direction, first direction)
Y Y-direction (first direction, second direction)
Z Z-direction (third direction)

What is claimed is:

1. A semiconductor device comprising one parallel transistor in which a plurality of vertical transistors disposed in an active region on a semiconductor substrate are connected in parallel, wherein the parallel transistor comprises:
   a plurality of semiconductor pillars protruding out in a direction perpendicular to a main surface of the semiconductor substrate;
   a lower diffusion layer disposed below the plurality of semiconductor pillars;
   a plurality of upper diffusion layers, disposed respectively at the top of the plurality of semiconductor pillars; and
   a gate electrode disposed over the side surfaces, in their entirety, of the plurality of semiconductor pillars, with the interposition of a gate insulating film;
   and wherein the plurality of upper diffusion layers are connected to one upper contact plug disposed on the plurality of upper diffusion layers, and wherein the one upper contact plug is connected to a wiring line disposed on the one upper contact plug.

2. The semiconductor device as claimed in claim 1, wherein each of the plurality of upper diffusion layers comprises:
   a diffusion layer disposed at the top of the semiconductor pillar; and
   a silicon plug connected to an upper surface of said diffusion layer.

3. The semiconductor device as claimed in claim 1, comprising an insulating film provided at the peripheries of the plurality of semiconductor pillars, wherein the lower diffusion layer and the gate electrode are electrically insulated from one another by means of said insulating film.

4. The semiconductor device as claimed in claim 1, wherein the lower diffusion layer is connected to a lower contact plug.

5. A semiconductor device comprising:
   an element isolation region disposed in a main surface of a semiconductor substrate;
   a first active region and a second active region which are enclosed by the element isolation region and are adjacent to one another in a first direction; and
   an intermediate element isolation region sandwiched between the first active region and the second active region;
   wherein the first active region comprises:
      a first semiconductor pillar adjacent to the intermediate element isolation region;
      a first upper diffusion layer located at the top of the first semiconductor pillar;
      a second semiconductor pillar adjacent, in the first direction, to the first semiconductor pillar;
      a second upper diffusion layer located at the top of the second semiconductor pillar;
      a continuous first gate electrode enclosing the peripheries of the first semiconductor pillar and the second semiconductor pillar;
      a first lower diffusion layer disposed below the first and second semiconductor pillars;
   the second active region comprises:
      a third semiconductor pillar adjacent to the intermediate element isolation region;
      a third upper diffusion layer located at the top of the third semiconductor pillar;
      a fourth semiconductor pillar adjacent, in the first direction, to the third semiconductor pillar;
      a fourth upper diffusion layer located at the top of the fourth semiconductor pillar;
      a continuous second gate electrode enclosing the peripheries of the third semiconductor pillar and the fourth semiconductor pillar;
      a second lower diffusion layer disposed below the third and fourth semiconductor pillars, wherein the first and second lower diffusion layers are connected respectively to first and second lower contact plugs; and
   the intermediate element isolation region comprises:
      a dummy pillar extending in the first direction, spanning between the first active region and the second active region; and
      a power-feed gate electrode enclosing the periphery of the dummy pillar;
      the first gate electrode and the second gate electrode are each connected to the power-feed gate electrode;
      the first upper diffusion layer and the second upper diffusion layer are connected to one first upper contact plug; and
      the third upper diffusion layer and the fourth upper diffusion layer are connected to one second upper contact plug.

6. The semiconductor device as claimed in claim 5, wherein:
   the semiconductor device additionally comprises an insulating film provided at the peripheries of the first to fourth semiconductor pillars;
   the first lower diffusion layer and the first gate electrode are electrically insulated from one another by means of the insulating film; and
   the second lower diffusion layer and the second gate electrode are electrically insulated from one another by means of the insulating film.

7. A semiconductor device comprising:
   an element isolation region disposed in a main surface of a semiconductor substrate; and
   a first active region and a second active region which are enclosed by the element isolation region and are adjacent to one another in a first direction, with the interposition of an intermediate element isolation region;
   wherein the first active region comprises:
      first and second semiconductor pillars which are adjacent to the intermediate element isolation region and are adjacent to one another in a second direction orthogonal to the first direction;
      first and second upper diffusion layers located respectively at the top of the first and second semiconductor pillars; and
      a continuous first gate electrode enclosing the peripheries of the first semiconductor pillar and the second semiconductor pillar;
   the second active region comprises:
      third and fourth semiconductor pillars which are adjacent to the intermediate element isolation region and are adjacent to one another in the second direction orthogonal to the first direction;
      third and fourth upper diffusion layers located respectively at the top of the third and fourth semiconductor pillars; and
      a continuous second gate electrode enclosing the peripheries of the third semiconductor pillar and the fourth semiconductor pillar; and
   the intermediate element isolation region comprises:
      a dummy pillar extending in the first direction, spanning between the first active region and the second active region; and
      a power-feed gate electrode enclosing the periphery of the dummy pillar;
      the first gate electrode and the second gate electrode are each connected to the power-feed gate electrode; and
      the first upper diffusion layer to the fourth upper diffusion layer are connected to one upper contact plug.

8. The semiconductor device as claimed in claim 7, wherein the first active region and the second active region are formed from semiconductor regions having the same conduction type.

9. The semiconductor device as claimed in claim 8, wherein:
   the first active region is provided with a first lower diffusion layer disposed below the first and second semiconductor pillars;

the second active region is provided with a second lower diffusion layer disposed below the third and fourth semiconductor pillars;

the semiconductor device additionally comprises an insulating film provided at the peripheries of the first to fourth semiconductor pillars;

the first lower diffusion layer and the first gate electrode are electrically insulated from one another by means of the insulating film; and the second lower diffusion layer and the second gate electrode are electrically insulated from one another by means of the insulating film.

10. The semiconductor device as claimed in claim 9, wherein the first and second lower diffusion layers are connected respectively to first and second lower contact plugs.

11. The semiconductor device as claimed in claim 7, wherein the first active region and the second active region are formed from semiconductor regions having mutually different conduction types.

12. The semiconductor device as claimed in claim 11, wherein:

the first active region is provided with a first lower diffusion layer disposed below the first and second semiconductor pillars;

the second active region is provided with a second lower diffusion layer disposed below the third and fourth semiconductor pillars;

the semiconductor device additionally comprises an insulating film provided at the peripheries of the first to fourth semiconductor pillars;

the first lower diffusion layer and the first gate electrode are electrically insulated from one another by means of the insulating film; and the second lower diffusion layer and the second gate electrode are electrically insulated from one another by means of the insulating film.

13. The semiconductor device as claimed in claim 12, wherein the first and second lower diffusion layers are connected respectively to first and second lower contact plugs.

14. The semiconductor device as claimed in claim 12, wherein:

the first active region is formed from a semiconductor region having a first conduction type;

the second active region is formed from a semiconductor region having a second conduction type which is different from the first conduction type;

the first and second upper diffusion layers and the first lower diffusion layer are formed from diffusion layers having the second conduction type; and the third and fourth upper diffusion layers and the second lower diffusion layer are formed from diffusion layers having the first conduction type.

* * * * *